(12) United States Patent
Kawabata

(10) Patent No.: US 8,912,034 B2
(45) Date of Patent: Dec. 16, 2014

(54) METHOD FOR MANUFACTURING ENERGY RAY DETECTION DEVICE

(75) Inventor: Yasuhiro Kawabata, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 194 days.

(21) Appl. No.: 13/536,750

(22) Filed: Jun. 28, 2012

(65) Prior Publication Data

US 2013/0011955 A1    Jan. 10, 2013

(30) Foreign Application Priority Data

Jul. 7, 2011 (JP) .................................. 2011-150894

(51) Int. Cl.
*H01L 21/00* (2006.01)
*H01L 31/103* (2006.01)
*H01L 27/146* (2006.01)

(52) U.S. Cl.
CPC ........ *H01L 27/14603* (2013.01); *H01L 31/103* (2013.01)
USPC ..................................... 438/69; 257/E31.129

(58) Field of Classification Search
CPC ........................ H01L 27/14603; H01L 31/103
USPC ..................................... 438/69; 257/E31.129
See application file for complete search history.

(56) References Cited

FOREIGN PATENT DOCUMENTS

| JP | 2000-286443 A | 10/2000 |
|---|---|---|
| JP | 2000-312024 A | 11/2000 |
| JP | 2002-344809 A | 11/2002 |
| JP | 2005-197674 A | 7/2005 |
| JP | 2006-165143 A | 6/2006 |
| JP | 2006-165161 A | 6/2006 |
| JP | 2007-81083 A | 3/2007 |

*Primary Examiner* — Stephen W Smoot
*Assistant Examiner* — Vicki B Booker
(74) *Attorney, Agent, or Firm* — Canon USA, Inc. IP Division

(57) ABSTRACT

In a method for manufacturing an energy ray detection device including a first semiconductor region disposed below a first area on a surface of a semiconductor substrate, a second semiconductor region disposed below a second area on the surface and connected to a contact portion, and a third semiconductor region disposed below a third area on the surface between the first area and the second area, the first semiconductor region and the third semiconductor region are formed on the semiconductor substrate by performing ion implantation through a buffer film that covers the first area and the third area, a portion of the buffer film that covers the third area having a thickness smaller than a portion of the buffer film that covers the first area.

19 Claims, 14 Drawing Sheets

FIG. 2
FIG. 2A
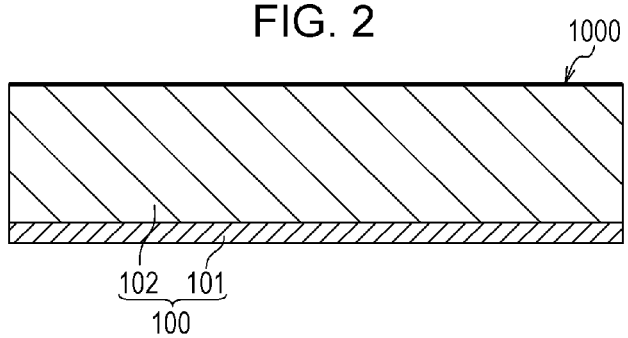
FIG. 2B
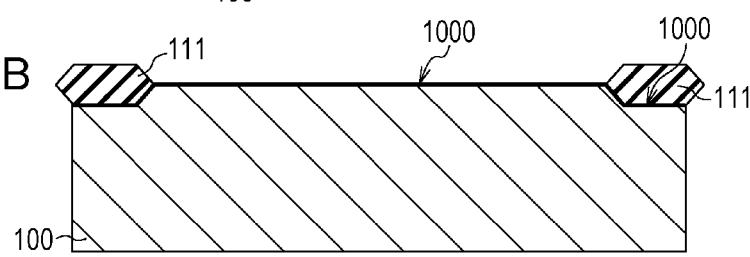
FIG. 2C
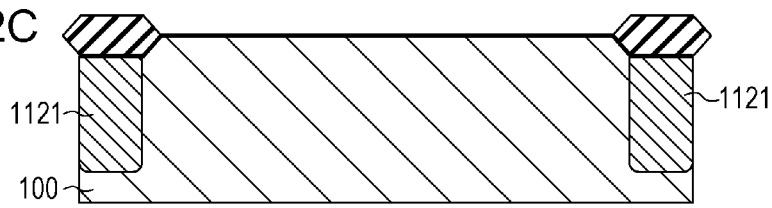
FIG. 2D
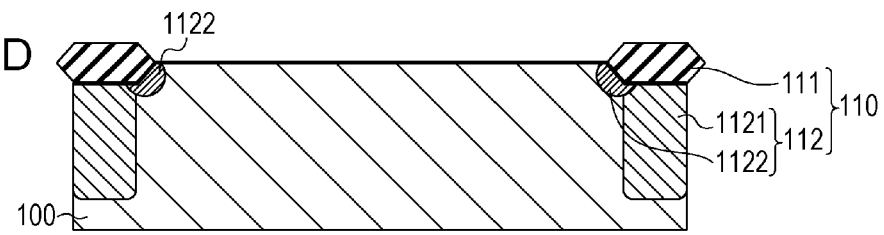
FIG. 2E
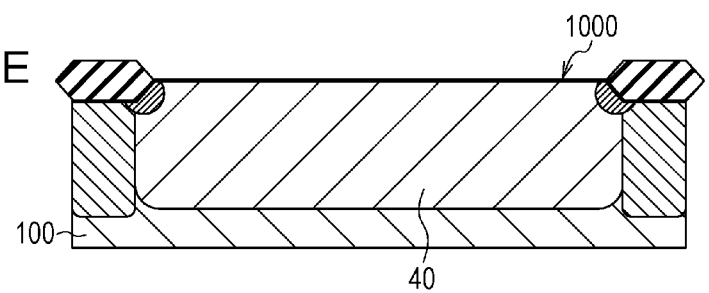

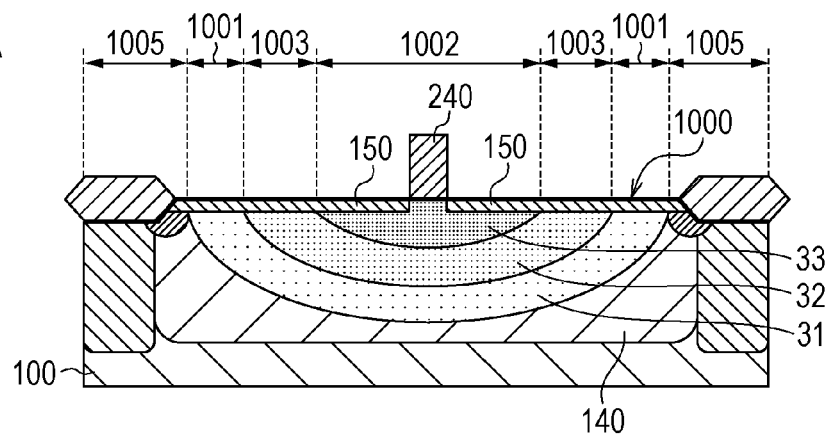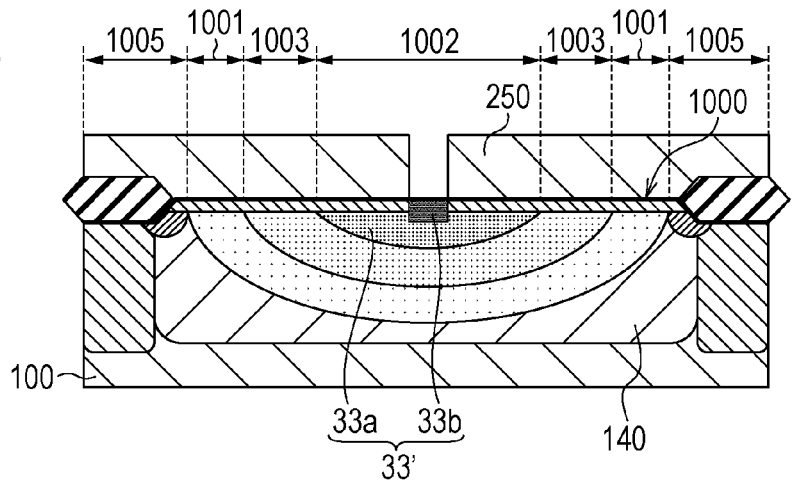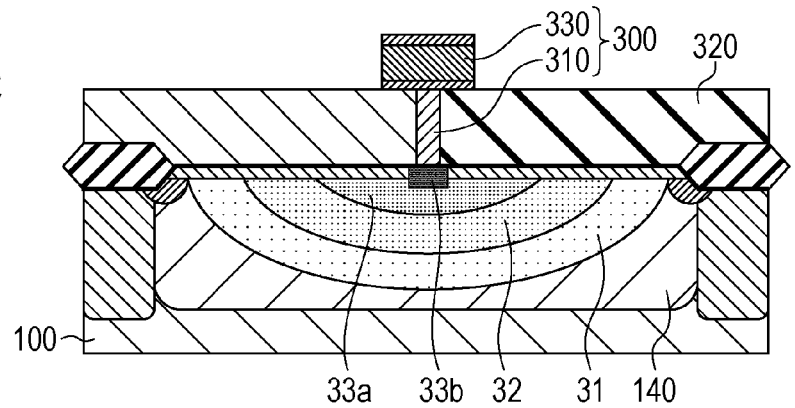

US 8,912,034 B2

METHOD FOR MANUFACTURING ENERGY RAY DETECTION DEVICE

BACKGROUND OF THE INVENTION

1. Field of the Invention

One disclosed aspect of the embodiments relates to a method for manufacturing an energy ray detection device.

2. Description of the Related Art

As is known in the art, an energy ray detection device is manufactured as a semiconductor device using a widely used semiconductor process.

The energy ray detection device includes an active part having a charge generation element that generates signal charge, and a conductive contact portion connected to the active part, and detects the signal charge via the contact portion. Specifically, the contact portion is electrically connected to, for example, a gate of an amplifier transistor of an amplifier circuit, thus obtaining an amplified signal in accordance with the amount of signal charge. In order to accurately detect energy rays, it is effective to efficiently collect signal charge in a portion of the active part in the vicinity of the contact portion.

Japanese Patent Laid-Open No. 2000-312024 discloses that a plurality of regions (a second semiconductor region and an inner region) having different impurity concentrations are formed in a semiconductor region and therefore a potential gradient which enables charge to move towards an electrode region is formed.

Japanese Patent Laid-Open No. 2007-81083 discloses a line sensor in which a second impurity region includes a first portion and a second portion arranged so as to surround the first portion, and the first portion has a higher impurity concentration than the second portion.

In Japanese Patent Laid-Open No. 2000-312024, the second semiconductor region and the inner region are formed by forming a photoresist pattern twice and performing ion implantation using each photoresist pattern as a mask. This method may make it difficult to form a desired potential gradient, and sufficient signal charge may not necessarily be collected in the electrode region.

SUMMARY OF THE INVENTION

In an aspect of the embodiments, there is provided a method for manufacturing an energy ray detection device including an active part and a contact portion connected to the active part, the active part including a semiconductor region having a first conductivity type where signal charge generated in accordance with energy rays resides as majority carriers. The semiconductor region includes a first region disposed below a first area on a surface of a semiconductor substrate, a second region disposed below a second area on the surface and connected to the contact portion, and a third region disposed below a third area on the surface between the first area and the second area. The method includes the operations of forming a buffer film on the semiconductor substrate, the buffer film covering the first area and the third area, a portion of the buffer film that covers the third area having a thickness smaller than a portion of the buffer film that covers the first area; and forming the first region and the second region by performing ion implantation of impurities having the first conductivity type into the semiconductor substrate through the buffer film.

Further features of the disclosure will become apparent from the following description of exemplary embodiments with reference to the attached drawings.

BRIEF DESCRIPTION OF THE DRAWINGS

FIGS. 2A to 2E are schematic cross-sectional views illustrating a method (operations a to e) for manufacturing the energy ray detection device according to the first embodiment.

FIGS. 5A to 5C are schematic cross-sectional views illustrating the method (operations i to k) for manufacturing the energy ray detection device according to the first embodiment.

DESCRIPTION OF THE EMBODIMENTS

Figure 1A:
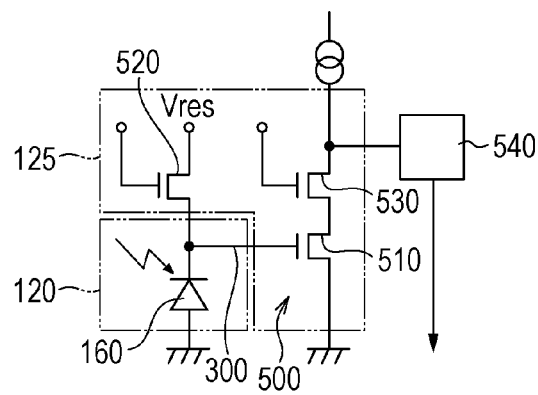
FIG. 1A is an electrical circuit diagram of an energy ray detection device according to a first embodiment.

An overview of an energy ray detection device according to an embodiment (hereinafter referred to simply as a "detection device") will be described. The detection device includes a conversion unit that converts energy rays into signal charge. The conversion unit has a charge generation element that generates signal charge in accordance with energy rays to be applied to the detection device. It is to be understood that the energy rays to be applied to the detection device need to be applied to at least the conversion unit. Examples of the energy rays to be applied to the detection device include light rays such as visible light rays (having a wavelength of 360 nm to 730 nm), infrared light rays, and ultraviolet light rays, radiation rays such as X-rays and gamma rays, and particle beams such as electron beams and ion beams. However, the physical quantity with which the charge generation element reacts may not necessarily be identical to the energy rays to be applied to the conversion unit (that is, the energy rays to be detected by the detection device). For example, the physical quantity with which the charge generation element reacts may be part of the energy rays to be applied to the conversion unit, or may be energy rays of a different type from the energy rays to be applied to the conversion unit. For example, the conversion unit may include a wavelength selection member that selects a wavelength with which the charge generation element reacts from the energy rays applied to the detection device. Further, the conversion unit may include a wavelength conversion member that converts the wavelength of the energy rays applied to the detection device into the wavelength of energy rays with which the charge generation element reacts.

The detection device includes a detection unit that detects signal charge generated by the conversion unit. The detection unit generates a signal in accordance with the amount of signal charge, and the amount of signal charge depends on the intensity of energy rays. Thus, the generated signal may be an intensity signal indicating the intensity of energy rays. Therefore, the energy rays applied may be detected using the intensity signal. The detection unit may include, for example, an amplifier circuit that generates an amplified signal, and a signal processing circuit that performs signal processing such as noise reduction from the amplified signal. The intensity signal is typically a voltage signal or a current signal.

Examples of the detection device include a measurement device that simply detects the intensity of energy rays. The disclosure may be suitably applied to an imaging device (image sensor) that acquires an intensity distribution of energy rays as an image. An imaging device such as an area sensor may be obtained by arranging multiple charge generation elements in a two-dimensional array. Furthermore, an imaging device such as a line sensor may be obtained by arranging multiple charge generation elements in a one-dimensional array, and is displaced relative to the target to be imaged to generate an image of the target to be imaged.

The detection device has a semiconductor substrate, and the charge generation element included in the conversion unit is formed as a semiconductor element on the semiconductor substrate. Typically, the detection unit may also be formed as an integrated circuit on the same semiconductor substrate as the semiconductor substrate on which the charge generation element is formed. The detection unit may also be formed on a substrate different from the semiconductor substrate on which the charge generation element is formed. The semiconductor substrate is typically a single-crystal silicon (Si) substrate, or may be a single-crystal germanium (Ge) substrate, a single-crystal gallium arsenide (GaAs) substrate, or the like.

The charge generation element is generally a photodiode having a PN junction, or may be a photogate having a Metal-Insulator-Semiconductor (MIS) junction. The photodiode has a first-conductivity-type semiconductor region and a second-conductivity-type semiconductor region that form a PN junction. In the following description, a semiconductor region having a conductivity type in which charge used as signal charge resides as majority carriers is defined as a first-conductivity-type semiconductor region. A semiconductor region having a conductivity type in which charge used as signal charge resides as minority carriers is defined as a second-conductivity-type semiconductor region. The charge used as signal charge may be signal charge itself, or may be charge that is not signal charge but has the same polarity as signal charge and behaves as, for example, noise.

For example, if electrons generated in a photodiode are used as signal charge, out of an N-type semiconductor region and a P-type semiconductor region that form the photodiode, the N-type semiconductor region is referred to as a first-conductivity-type semiconductor region and the P-type semiconductor region is referred to as a second-conductivity-type semiconductor region. Holes may be used as signal charge. In this case, the P-type semiconductor region is referred to as a first-conductivity-type semiconductor region, and the N-type semiconductor region is referred to as a second-conductivity-type semiconductor region. While signal charge may be generated not only in the first-conductivity-type semiconductor region but also in the second-conductivity-type semiconductor region of the photodiode, one aspect of the embodiments focuses on the first-conductivity-type semiconductor region. The signal charge generated in the second-conductivity-type semiconductor region moves from the second-conductivity-type semiconductor region to the first-conductivity-type semiconductor region through the depletion layer. Consequently, the majority of the signal charge existing in the charge generation element exists in the first-conductivity-type semiconductor region. In a detection device having a charge generation element, therefore, focusing on a first-conductivity-type semiconductor region is effective to understand the behavior of signal charge. In a photogate, a semiconductor region that forms a MIS junction (that adjoins an insulator) is referred to as a first-conductivity-type semiconductor region.

The detection device according to one aspect of the embodiments has the following configuration: A surface of the semiconductor substrate includes a first area, a second area, and a third area between the first area and the second area. A first-conductivity-type first semiconductor region is disposed below the first area. A first-conductivity-type second semiconductor region is disposed below the second area. A first-conductivity-type third semiconductor region is disposed below the third area. The first to third semiconductor regions are included in a portion of the conversion unit. A contact portion that connects the conversion unit to the detection unit is connected to the second semiconductor region.

In one aspect of the embodiments, in the detection device having the above configuration, which is a semiconductor device, the first semiconductor region and the third semiconductor region are formed on the semiconductor substrate by performing ion implantation of first-conductivity-type impurities through a buffer film. The buffer film used here covers the first area and the third area, and a portion of the buffer film that covers the third area has a thickness smaller than the thickness of a portion of the buffer film that covers the first area.

By manufacturing a detection device in the above way, it is possible to easily make the impurity concentration of the third semiconductor region higher than the impurity concentration of the first semiconductor region. Accordingly, the signal charge existing in the first semiconductor region may easily move to the third semiconductor region. Therefore, the efficiency of collecting signal charge gathering in the second semiconductor region located on the further side of the third semiconductor region with respect to the first semiconductor region is increased, resulting in a larger amount of signal charge appearing in the vicinity of a contact portion connected to the second semiconductor region. Therefore, a detection device with improved accuracy of detecting energy rays may be obtained.

Embodiments of the disclosure will be described hereinafter with reference to the drawings by taking an example in which a charge generation element is a photodiode, signal charge resides as electrons, and a semiconductor substrate is a single-crystal silicon substrate.

First Embodiment

FIG. 1A is an electrical circuit diagram of a detection device according to a first embodiment. In this embodiment, a contact portion 300 is connected to a cathode of a charge generation element 160 that is a photodiode. The contact portion 300 is connected to an amplifier circuit 500. The amplifier circuit 500 includes at least an amplifier transistor 510. In the illustrated example, the amplifier circuit 500 further includes a reset transistor 520 and a selection transistor 530. The contact portion 300 is connected to a gate electrode of the amplifier transistor 510 and a main electrode (source or drain) of the reset transistor 520. A constant current source is connected to the source of the amplifier transistor 510 via main electrodes (source and drain) of the selection transistor 530.

The reset transistor 520 is turned on, thereby allowing the potential of the cathode of the charge generation element 160 to be defined to a reset potential Vres. After the reset transistor 520 is turned off, the charge corresponding to the intensity of energy rays is generated in the charge generation element 160, and is accumulated in the charge generation element 160. The gate electrode of the amplifier transistor 510 connected to the contact portion 300 is defined to the potential corresponding to the amount of charge generated in the charge generation element 160 via the contact portion 300. The selection transistor 530 is turned on, thereby allowing a voltage corresponding to the potential of the gate electrode of the amplifier transistor 510 to appear at a node connected to one of the main electrodes of the selection transistor 530, and the voltage may be obtained as an amplified signal. The amplified signal is input to a signal processing circuit 540, is subjected to processing such as noise reduction, and is taken as an intensity signal indicating the intensity of energy rays.

The illustrated electrical circuit is formed as an integrated circuit on the semiconductor substrate. The charge generation element 160 is disposed in an active part 120 (first active part) on the semiconductor substrate, and at least the amplifier transistor 510 of the amplifier circuit 500 is disposed in another active part 125 (second active part) on the semiconductor substrate. While, in the illustrated example, the reset transistor 520 and the selection transistor 530 are disposed in the active part 125, at least one of them may be disposed in an active part different than the active part 120 and the active part 125. Furthermore, the selection transistor 530 may not necessarily be used, and a main electrode of the amplifier transistor 510 may be connected directly to the constant current source.

Figure 1B:
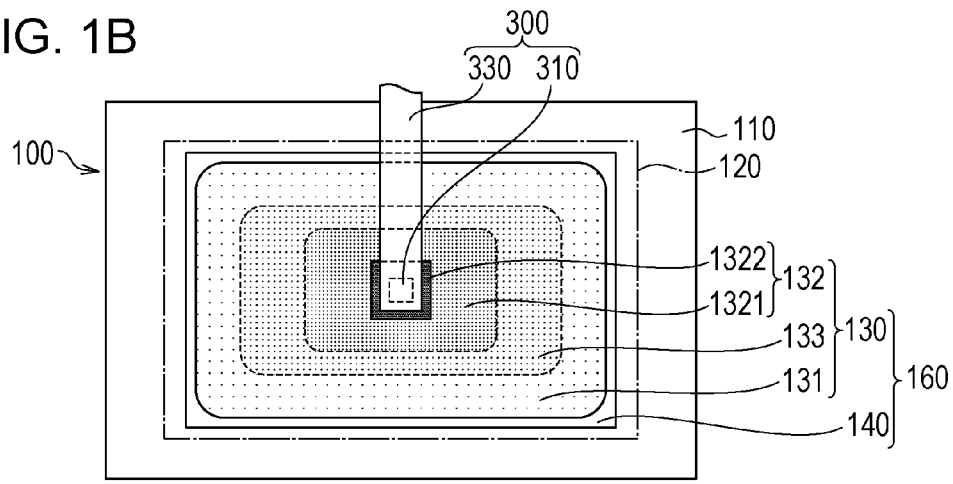
FIG. 1B is a schematic plan view of the energy ray detection device according to the first embodiment.
Figure 1C:
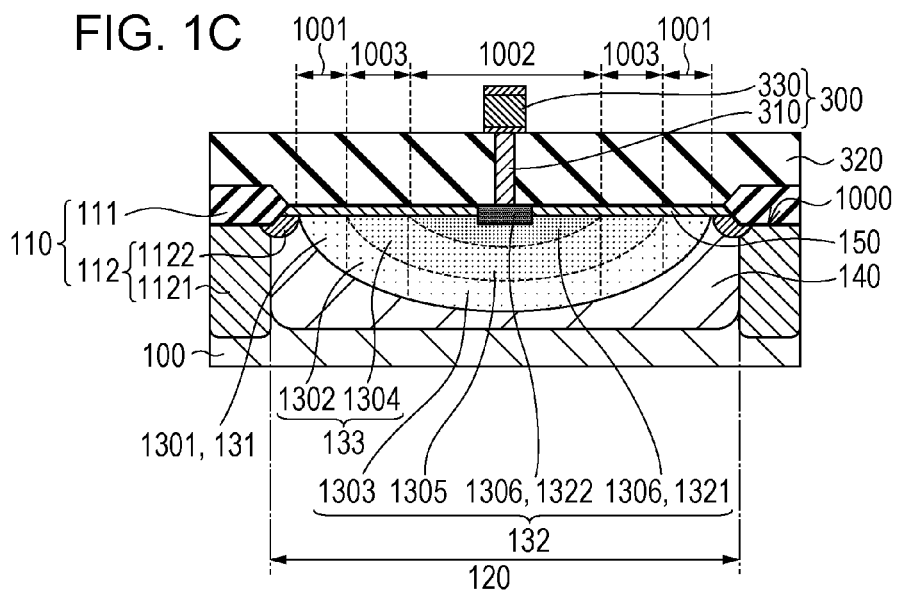
FIG. 1C is a schematic cross-sectional view of the energy ray detection device according to the first embodiment.

FIG. 1B is a schematic plan view of a portion of the active part 120 and its vicinity where the charge generation element 160 is disposed on a semiconductor substrate 100, and FIG. 1C is a schematic cross-sectional view of the portion of the active part 120 and its vicinity. The active part 120 is disposed below a surface 1000 of the semiconductor substrate 100 (inside the semiconductor substrate 100). In the illustrated example, the charge generation element 160 occupies the majority of the active part 120, when viewed in plan. That is, a PN junction part of the charge generation element 160 extends substantially over the entire region of the active part 120. The active part 120 will be described with cross-reference to FIGS. 1B and 1C.

The charge generation element 160 has a first charge generation region 130 that is a first-conductivity-type semiconductor region, and a second charge generation region 140 that is a second-conductivity-type semiconductor region, and the first charge generation region 130 and the second charge generation region 140 form a PN junction. The first charge generation region 130 is disposed between the surface 1000 of the semiconductor substrate 100 and the second charge generation region 140. Charge generated in the first charge generation region 130 and the second charge generation region 140 is accumulated in the first charge generation region 130. That is, the first charge generation region 130 also functions as an accumulation region.

The first charge generation region 130 has a first semiconductor region 131, a second semiconductor region 132, and a third semiconductor region 133, each of which is a first-conductivity-type semiconductor region.

Here, the surface 1000 of the semiconductor substrate 100 will be described. For convenience of illustration, the surface 1000 is divided into a plurality of areas including a first area 1001, a second area 1002, and a third area 1003. The third area 1003 is located between the first area 1001 and the second area 1002. In this embodiment, the first area 1001 surrounds the third area 1003, and the second area 1002 is surrounded by the third area 1003. In the illustrated example, the third area 1003 is continuous with the first area 1001, and is also continuous with the second area 1002.

The first semiconductor region 131 is disposed below the first area 1001, the second semiconductor region 132 is disposed below the second area 1002, and the third semiconductor region 133 is disposed below the third area 1003. The third semiconductor region 133 is disposed between the first semiconductor region 131 and the second semiconductor region 132. Therefore, the third semiconductor region 133 may also be referred to as an intermediate semiconductor region. In this embodiment, the first semiconductor region 131 surrounds the third semiconductor region 133, and the second semiconductor region 132 is surrounded by the third semiconductor region 133. In the illustrated example, the third semiconductor region 133 is continuous with the first semiconductor region 131, and is also continuous with the second semiconductor region 132.

The first charge generation region 130 will be described in more detail hereinafter.

The first charge generation region 130 includes a first concentration part 1301, a second concentration part 1302, a third concentration part 1303, a fourth concentration part 1304, a fifth concentration part 1305, and a sixth concentration part 1306, each of which is a first-conductivity-type semiconductor region.

The first semiconductor region 131 has the first concentration part 1301. The first concentration part 1301 and the second charge generation region 140 form a PN junction.

The second semiconductor region 132 includes the third concentration part 1303, the fifth concentration part 1305, and the sixth concentration part 1306 in this order from the second charge generation region 140 side toward the second area 1002 side. The third concentration part 1303 and the second charge generation region 140 form a PN junction.

The third semiconductor region 133 includes the second concentration part 1302 and the fourth concentration part 1304 in this order from the second charge generation region 140 side toward the third area 1003 side. The second concentration part 1302 and the second charge generation region 140 form a PN junction.

The impurity concentrations of the first to sixth concentration parts 1301 to 1306 will be described. The impurity concentrations of the fourth concentration part 1304 and the fifth concentration part 1305 are higher than the impurity concentrations of the first concentration part 1301, the second concentration part 1302, and the third concentration part 1303, and are lower than the impurity concentration of the sixth concentration part 1306.

The first concentration part 1301, the second concentration part 1302, and the third concentration part 1303 have substantially the same impurity concentration. However, preferably, the impurity concentration of the third concentration part 1303 is higher than the impurity concentration of the first concentration part 1301, and the impurity concentration of the second concentration part 1302 is between the impurity concentration of the first concentration part 1301 and the impurity concentration of the third concentration part 1303.

Further, the fourth concentration part 1304 and the fifth concentration part 1305 have substantially the same impurity concentration. However, preferably, the impurity concentration of the fifth concentration part 1305 is higher than the impurity concentration of the fourth concentration part 1304.

In summary, the impurity concentrations of the first to sixth concentration parts 1301 to 1306 satisfy the relationship of first concentration part 1301≦second concentration part 1302≦third concentration part 1303<<fourth concentration part 1304≦fifth concentration part 1305<<sixth concentration part 1306.

In the illustrated example, the sixth concentration part 1306 of the second semiconductor region 132 has a low-concentration portion 1321 and a high-concentration portion 1322. The impurity concentrations of the low-concentration portion 1321 and the high-concentration portion 1322 are higher than the impurity concentrations of the fourth concentration part 1304 and the fifth concentration part 1305. The low-concentration portion 1321 is located between the high-concentration portion 1322 and the fourth and fifth concentration parts 1304 and 1305, and adjoins the high-concentration portion 1322. The sixth concentration part 1306 may not necessarily have the low-concentration portion 1321 and the high-concentration portion 1322, and may have a uniform impurity concentration distribution.

The charge generation element 160 in the illustrated example further has a surface region 150 that is a second-conductivity-type semiconductor region between the surface 1000 of the semiconductor substrate 100 and the first charge generation region 130. Generally, crystal defects are likely to occur in the vicinity of the surface 1000 of the semiconductor substrate 100, thereby causing a noise source such as a dark-current source. The surface region 150 may reduce the influence of noise. In this manner, the charge generation element 160 in the illustrated example is the so-called pinned photodiode.

The second charge generation region 140 may have a plurality of second-conductivity-type semiconductor regions with different impurity concentrations. For example, the second charge generation region 140 may include a second-conductivity-type fourth semiconductor region, a second-conductivity-type fifth semiconductor region, and a second-conductivity-type sixth semiconductor region between the fourth semiconductor region and the fifth semiconductor region. Here, the fourth semiconductor region is disposed deeper in the semiconductor substrate 100 than the sixth semiconductor region. The second-conductivity-type fifth semiconductor region and the second-conductivity-type second semiconductor region 132 form a PN junction. In the second charge generation region 140 having the above structure, preferably, the relationship of C6<C5<C4 is satisfied, where C4 denotes the impurity concentration of the fourth semiconductor region, C5 denotes the impurity concentration of the fifth semiconductor region, and C6 denotes the impurity concentration of the sixth semiconductor region. This configuration is disclosed in Japanese Patent Laid-Open No. 2005-197674. The second charge generation region 140 may have an impurity concentration of $10^{15}$ to $10^{18}$ atoms/cm$^3$.

The active part 120 is surrounded by an isolation part 110 to isolate the active part 120 from the active part 125. In the illustrated example, by way of example, the isolation part 110 includes an isolation insulator 111 (silicon oxide film) formed by the local oxidation of silicon (LOCOS) process. Alternatively, a shallow trench isolation (STI) structure in which the isolation insulator 111 is embedded into a recess formed in the semiconductor substrate 100 may be used, or the active part 120 and the active part 125 may be isolated (diffusion isolation) from each other by a PN junction. The isolation part 110 in the illustrated example includes the isolation insulator 111 and an isolation region 112 that is a second-conductivity-type semiconductor region disposed in close proximity to the isolation insulator 111. The isolation region 112 has a higher impurity concentration than the second charge generation region 140. The isolation region 112 has a first isolation region 1121 and a second isolation region 1122. The first isolation region 1121 is disposed on the bottom surface of the isolation insulator 111, and the second isolation region 1122 is disposed in contact with a side surface of the isolation insulator 111 (the bottom surface of a bird's beak). Semiconductor crystal defects are likely to occur in the vicinity of the isolation insulator 111, thereby causing a noise source (dark-current source). The second isolation region 1122 may reduce the influence of noise. The isolation part 110 and the active part 120 are arranged so that a portion of the isolation part 110 (the bird's beak of the isolation insulator 111 and the second isolation region 1122) overlaps the active part 120 when viewed in plan. Here, the impurity concentrations of the first isolation region 1121 and the second isolation region 1122 are set higher than the impurity concentration of the second charge generation region 140. This may suppress movement of charge between the second charge generation region 140 and the isolation region 112 even if the isolation region 112 and the second charge generation region 140 have the same conductivity type (second conductivity type). The first isolation region 1121 and the second isolation region 1122 may have an impurity concentration of $10^{15}$ to $10^{20}$ atoms/cm$^3$.

An interlayer insulating film 320 is formed on the semiconductor substrate 100 so as to cover the isolation part 110 and the active part 120. The interlayer insulating film 320 has a contact hole, and a contact plug 310 composed of tungsten is formed in the contact hole. The contact plug 310 is connected to the first semiconductor region 131, and the contact plug 310 and the first semiconductor region 131 form a Metal-Semiconductor (MS) junction. The MS junction is desirably an ohmic contact, or may be a Schottky contact. The term "MS junction" is a general term, and the contact plug 310 corresponding to "Metal" is not limited to a metal. That is, the contact plug 310 may be composed of polysilicon or metal compound such as nitride as long as the contact plug 310 is made of a material (conductor) having practical conductivity.

In the illustrated example, the contact plug 310 is connected to the high-concentration portion 1322 of the sixth concentration part 1306 included in the second semiconductor region 132. The contact plug 310 may be connected not only to the high-concentration portion 1322 but also to the low-concentration portion 1321 or to the fifth concentration part 1305 through the sixth concentration part 1306. A portion of the second semiconductor region 132 to which the contact plug 310 is connected (in the illustrated example, the high-concentration portion 1322 of the sixth concentration part 1306) may have an impurity concentration of $10^{17}$ to $10^{20}$ atoms/cm$^3$.

The contact plug 310 is connected to connection wiring 330 disposed on the interlayer insulating film 320. The contact plug 310 and the connection wiring 330 form the contact portion 300 connected to the charge generation element 160. The connection wiring 330 is disposed above the isolation part 110, and is connected to the amplifier circuit 500 while crossing above the isolation part 110. More specifically, the connection wiring 330 is connected to another contact plug (not shown) included in the contact portion 300 connected to the gate electrode of the amplifier transistor 510. In this manner, the contact portion 300 connects the first active part 120 to the second active part 125 across the isolation part 110.

The charge generated in the first charge generation region 130 moves in the first charge generation region 130 in accordance with a potential distribution produced in the first charge generation region 130. According to this embodiment, the impurity concentrations of the first semiconductor region 131 and the third semiconductor region 133 increase when coming closer to the first semiconductor region 131 to which the contact portion 300 is connected. For this reason, a potential distribution resulting from the impurity concentration distribution is produced in the first charge generation region 130. In the potential distribution, the potential of the third semiconductor region 133 is higher than the potential of the second semiconductor region 132. This allows the signal charge existing at a certain position in the first charge generation region 130 to easily move toward the contact portion 300. Therefore, the signal charge generated in the charge generation element 160 may be quickly and efficiently collected in the vicinity of the contact portion 300 (the second semiconductor region 132), and the accuracy with which the potential appearing at the gate electrode of the amplifier transistor 510 by signal charge is detected may be increased. As a result, a detection device capable of detecting energy rays more accurately than a detection device in which the first charge generation region 130 has no impurity concentration distributions may be obtained. In the illustrated example, the impurity concentrations of the third semiconductor region 133 and the first semiconductor region 131 also increase when coming closer to the first semiconductor region 131 to which the contact portion 300 is connected. This allows electrons that are the signal charge existing in the first charge generation region 130 to easily move from the third semiconductor region 133 toward an MS junction part between the first charge generation region 130 and the contact portion 300. In this manner, it is desirable that a concentration distribution in which signal charge easily moves to the vicinity of the contact portion 300 exist over substantially the entire first charge generation region 130. However, this embodiment is not limited to the above structure. That is, a concentration distribution in which signal charge easily moves to the vicinity of the contact portion 300 may be formed in at least a portion of the first charge generation region 130 by using the first semiconductor region 131 and the third semiconductor region 133.

A method for manufacturing a detection device having the above configuration will be described hereinafter focusing on, in particular, a method for forming the active part 120. In ion implantation, an N-type semiconductor region is formed by doping a semiconductor substrate with an N-type impurity, which becomes a donor, such as phosphorus (P), arsenic (As), or antimony (Sb), using ion implantation or the like. A P-type semiconductor region is formed by doping the semiconductor substrate with a P-type impurity, which becomes an acceptor, such as boron (B), aluminum (Al), or indium (In), using ion implantation or the like. A region implanted with an impurity to form a first-conductivity-type semiconductor region may be a first-conductivity-type semiconductor region, a second-conductivity-type semiconductor region, or an intrinsic semiconductor region. Implantation conditions in some ion implantation treatments, such as dopant, implantation energy, and dose, are given by way of example hereinafter. However, it is to be easily understood that a semiconductor region having substantially the same function as a semiconductor region formed under the given conditions may also be formed using implantation conditions different from the given implantation conditions.

(Operation a): This operation will be described with reference to FIG. 2A. A first-conductivity-type semiconductor layer 102 is formed on a first-conductivity-type base layer 101 (wafer) using epitaxial growth. Thus, as illustrated in FIG. 2A, a first-conductivity-type semiconductor substrate 100 having the base layer 101 and the semiconductor layer 102 is obtained. A surface 1000 of the semiconductor substrate 100 corresponds to the surface 1000 of the semiconductor layer 102 in this operation. The semiconductor layer 102 has a function for reducing generation of crystal defects on the surface 1000 of the semiconductor substrate 100. Epitaxial growth may not be performed, and the wafer itself may be used as the semiconductor substrate 100. The semiconductor substrate 100 may also have a Silicon On Insulator (SOI) structure. In the following description, the base layer 101 and the semiconductor layer 102 are described as the semiconductor substrate 100 without being distinguished from each other.

(Operation b): This operation will be described with reference to FIG. 2B. A silicon nitride film (not illustrated) is formed as a first mask on the semiconductor substrate 100, and a silicon oxide film serving as the isolation insulator 111 of the isolation part 110 is formed by the LOCOS process. After that, the first mask is removed.

(Operation c): This operation will be described with reference to FIG. 2C. A second mask (not illustrated) is formed so as to cover a region where the isolation insulator 111 of the isolation part 110 is not formed, and ion implantation is performed through the isolation insulator 111. Thus, a second-conductivity-type semiconductor region is formed as the first isolation region 1121. After that, the second mask is removed. The implantation energy of ion implantation to form the first isolation region 1121 is typically 100 Kev to 3 MeV if the dopant is B. The first isolation region 1121 may be formed by performing ion implantation a plurality of times with different implantation energies. The dose may be $10^{12}$ to $10^{14}$ ions/cm$^2$.

(Operation d): This operation will be described with reference to FIG. 2D. Ion implantation is performed in the vicinity of a side surface of the silicon oxide film (bird's beak). Thus, a second-conductivity-type semiconductor region is formed as the second isolation region 1122. Therefore, the isolation part 110 is formed. The implantation energy of ion implantation to form the second isolation region 1122 is typically 10 KeV to 500 KeV if the dopant is B. The second isolation region 1122 may be formed by performing ion implantation a plurality of times with different implantation energies. The dose may be $10^{12}$ to $10^{14}$ ions/cm$^2$. In this way, the isolation part 110 is formed.

(Operation e): This operation will be described with reference to FIG. 2E. A third mask (not illustrated) is formed so as to cover the isolation part 110, and ion implantation is performed. Thus, a second-conductivity-type well region 40 is formed. After that, the third mask is removed. In the operations a to e, the second-conductivity-type well region 40 is formed by performing ion implantation on the first-conductivity-type semiconductor substrate 100, by way of example; however, the second-conductivity-type semiconductor substrate 100 itself may be used as the well region 40. The implantation energy of ion implantation to form the well region 40 is typically 10 KeV to 3 MeV if the dopant is B. The dose may be $10^{11}$ to $10^{14}$ ions/cm$^2$. A portion of the well region 40 forms the second-conductivity-type second charge generation region 140 described above through an operation described below. The well region 40 may also be formed by performing ion implantation a plurality of times with different implantation energies and doses so that the second charge generation region 140 has the second-conductivity-type fourth to sixth semiconductor regions described above.

The operations b to e may be reordered. For example, after the operation b is performed, the operations c and d may be performed in reverse order. Further, for example, the operation b may be performed after the operations c and d are performed. In this case, ion implantation to form the isolation region 112 is performed not through the isolation insulator 111.

(Operation f): This operation will be described with reference to FIG. 3A. A photosensitive resin film 210 (photoresist) is formed so as to cover the semiconductor substrate 100. Then, the photosensitive resin film 210 is exposed to light by a gradation exposure method using a gradation photomask PM. In the illustrated example, a positive type photosensitive resin is used; however, a negative type photosensitive resin may be used instead. The thickness of the photosensitive resin film 210 is typically 5 μm to 10 μm although it should be determined as desired in accordance with the subsequent operations (especially, operations h and g).

(Operation g): This operation will be described with reference to FIG. 3B. The exposed photosensitive resin film 210 is developed. Thus, a buffer film 200 having a thickness distribution is formed as illustrated in FIG. 3B in accordance with the amount of light to which the photosensitive resin film 210 is exposed during the gradation exposure performed in the operation f. Since the positive type photosensitive resin film 210 is used in the operation f, a portion exposed to a large amount of light during gradation exposure becomes thin when developed.

Here, for convenience of description of the subsequent operations h to k, the surface 1000 of the semiconductor substrate 100 is divided into a plurality of areas including a first area 1001, a second area 1002, a third area 1003, and a protection area 1005. The third area 1003 is located between the first area 1001 and the second area 1002. In this embodiment, the first area 1001 surrounds the third area 1003, and the second area 1002 is surrounded by the third area 1003. In the illustrated example, the third area 1003 is continuous with the first area 1001, and is also continuous with the second area 1002. The protection area 1005 is continuous with the first area 1001.

As illustrated in FIG. 3B, the buffer film 200 covers the surface 1000 of the semiconductor substrate 100. Here, for convenience of description of the subsequent operation h, the buffer film 200 is divided into a plurality of portions including a first portion 201, a second portion 202, a third portion 203, and a protection portion 205. The first portion 201 covers the first area 1001, the second portion 202 covers the second area 1002, the third portion 203 covers the third area 1003, and the protection portion 205 covers the protection area 1005. The well region 40 is located below the first portion 201 and the first area 1001, below the second portion 202 and the second area 1002, and below the third portion 203 and the third area 1003. The isolation region 112 is located immediately below the protection portion 205 and the protection area 1005. The isolation insulator 111 is located between the protection portion 205 and the protection area 1005, and the protection portion 205 covers the isolation insulator 111.

The third portion 203 is located between the first portion 201 and the second portion 202. In this embodiment, the first portion 201 surrounds the third portion 203, and the second portion 202 is surrounded by the third portion 203. In the illustrated example, the third portion 203 is continuous with the first portion 201, and is also continuous with the second portion 202. The protection portion 205 is continuous with the first portion 201.

In this operation, the thickness of the third portion 203 is smaller than the thickness of the first portion 201. Further, the thickness of the second portion 202 is smaller than the thickness of the third portion 203. The thickness of the protection portion 205 is larger than the thickness of the first portion 201. In the illustrated example, the thicknesses of the first portion 201, the third portion 203, and the second portion 202 continuously change, and form a recessed surface with a monotonically decreasing thickness in this order. In the preceding operation f, gradation exposure is performed so that the above thickness distribution is obtained through development.

(Operation h): This operation will be described with reference to FIGS. 4A to 4C.

Figure 4A:
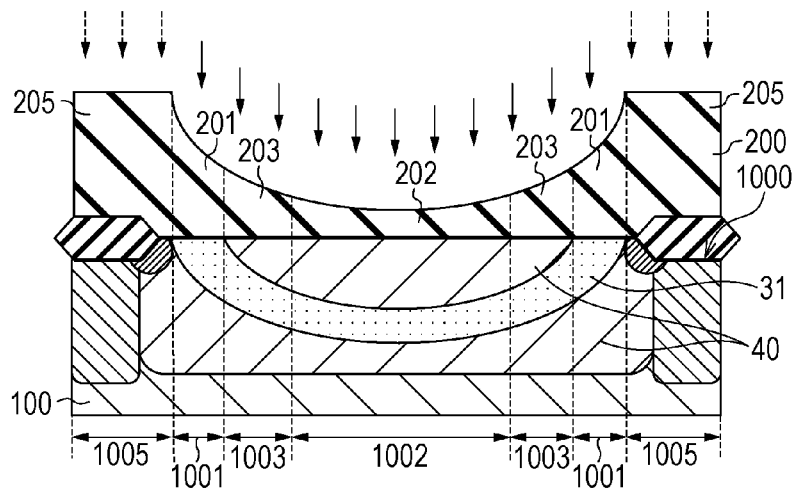
FIGS. 4A to 4C are schematic cross-sectional views illustrating the method (operation h) for manufacturing the energy ray detection device according to the first embodiment.
Figure 4B:
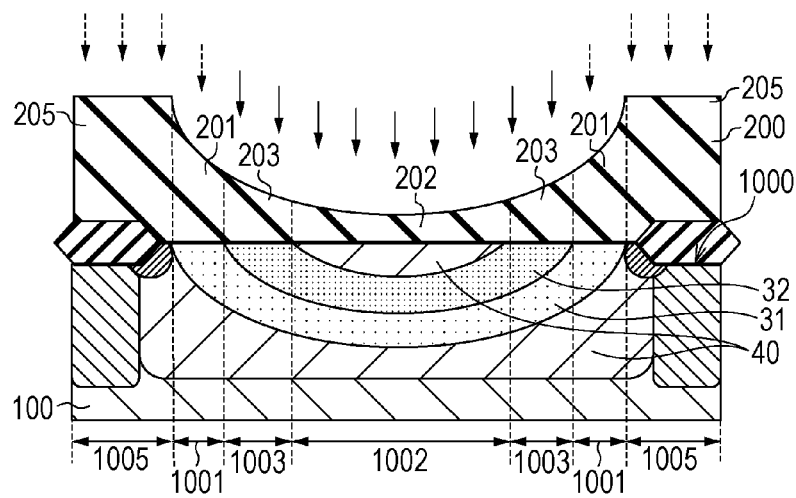
Figure 4C:
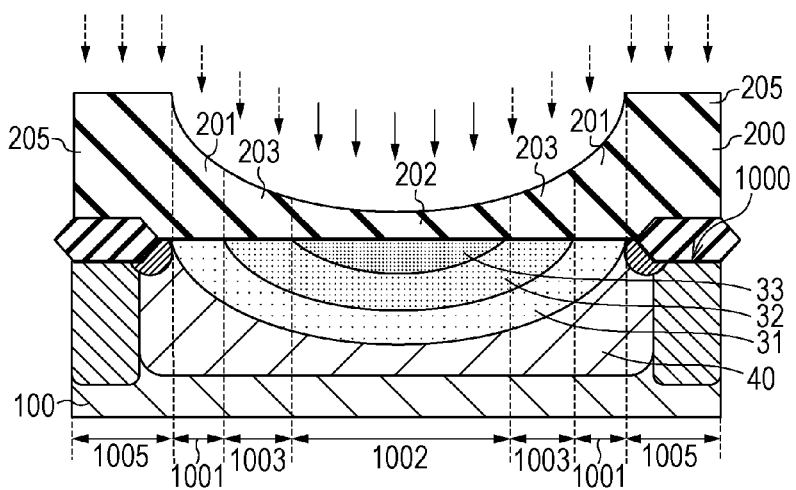

In this operation, ion implantation is performed on the semiconductor substrate 100 through the buffer film 200. Thus, the first charge generation region 130 is formed. In the illustrated example, ion implantation is performed three times. FIG. 4A illustrates first ion implantation that is the ion implantation for the first time, FIG. 4B illustrates second ion implantation that is the ion implantation for the second time, and FIG. 4C illustrates third ion implantation that is the ion implantation for the third time. The second ion implantation is carried out with implantation energy lower than the first ion implantation, and the third ion implantation is carried out with implantation energy lower than the second ion implantation. The first charge generation region 130 may be formed by single ion implantation through the buffer film 200 having a thickness distribution, but is desirably formed by performing ion implantation a plurality of times with different implantation energies as in the above manner. In addition, the doses (beam currents) in ion implantation performed a plurality of times with different implantation energies may differ. In the illustrated example, the second ion implantation is performed at a dose higher than the first ion implantation, and the third ion implantation is performed at a dose higher than the second ion implantation. The first charge generation region 130 may also be formed using a single implantation dose through the buffer film 200 having a thickness distribution, but is desirably formed by performing ion implantation a plurality of times at different doses as in the above manner.

In FIGS. 4A to 4C, the trajectories of ions in the first to third ion implantations are indicated by arrows. Solid line arrows indicate the trajectories of the ions to be implanted into the well region 40, and broken line arrows indicate the trajectories of the ions not implanted due to the obstruction of the buffer film 200.

In the first ion implantation, the protection portion 205 of the buffer film 200 functions as a mask. In contrast, ions are implanted into the well region 40 through the first portion 201, the second portion 202, and the third portion 203, which are thinner than the protection portion 205. The ions pass through the first area 1001, the second area 1002, and the third area 1003 while no ions pass through the protection area 1005.

Therefore, a first-conductivity-type first impurity layer 31 is formed below the first portion 201 and the first area 1001, below the second portion 202 and the second area 1002, and below the third portion 203 and the third area 1003.

In the second ion implantation, the protection portion 205 and the first portion 201 of the buffer film 200 function as masks. In contrast, ions are implanted into the well region 40 through the third portion 203 and the second portion 202, which are thinner than the first portion 201. The ions pass through the second area 1002 and the third area 1003 while no ions pass through the protection area 1005 and the first area 1001. Therefore, a first-conductivity-type second impurity layer 32 is formed below the third portion 203 and the third area 1003, and below the second portion 202 and the second area 1002. Below the third portion 203 and the second portion 202, the second impurity layer 32 is formed at a position shallower than the first impurity layer 31.

In the third ion implantation, the protection portion 205, the first portion 201, and the third portion 203 of the buffer film 200 function as masks. In contrast, ions are implanted into the well region 40 through the second portion 202, which is thinner than the third portion 203. The ions pass through the second area 1002 while no ions pass through the protection area 1005, the first area 1001, and the third area 1003. Therefore, a first-conductivity-type third impurity layer 33 is formed below the second portion 202 and the second area 1002. Below the second portion 202, the third impurity layer 33 is formed at a position shallower than the second impurity layer 32.

The implantation conditions of ion implantation in this operation will be described using a typical example in which the dopant of the first-conductivity-type semiconductor region is As. In the first ion implantation, the implantation energy is 1 MeV to 5 MeV and the implantation dose is $10^{11}$ to $10^{13}$ ions/cm$^2$. In the second ion implantation, the implantation energy is 500 KeV to 3 MeV and the implantation dose is $10^{12}$ to $10^{14}$ ions/cm$^2$. In the third ion implantation, the implantation energy is 100 KeV to 1 MeV and the implantation dose is $10^{13}$ to $10^{15}$ ions/cm$^2$. The implantation energies and doses in the first ion implantation, the second ion implantation, and the third ion implantation preferably satisfy the above magnitude relationships within the above ranges.

Ion implantation may be performed a plurality of times in order different from the order in the illustrated example. However, if the subsequent ion implantation is carried out with implantation energy higher than the preceding ion implantation, the subsequent ion implantation will be performed so that the ions pass through a semiconductor region formed by the preceding ion implantation. Thus, the impurity concentration of the semiconductor region formed by the preceding ion implantation may be different from the design value. In contrast, ion implantation is performed a plurality of times in descending order from the ion implantation performed with the highest implantation energy, thus enabling a reduction in the influence of the subsequent ion implantation on the semiconductor region formed by the preceding ion implantation. Therefore, a more desirable impurity concentration distribution may be formed.

Figure 6A:
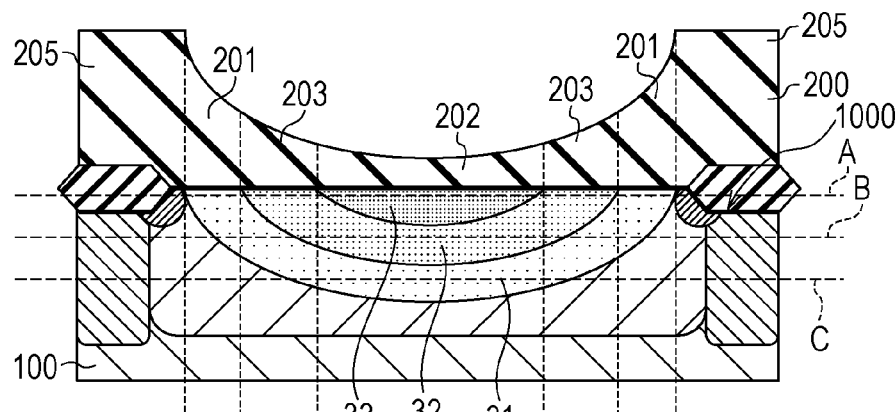
FIGS. 6A to 6C are schematic diagrams illustrating an impurity concentration distribution produced by ion implantation.

The impurity concentration distribution formed by this operation will be described with reference to FIGS. 6A to 6C. FIG. 6A is a cross-sectional view of the semiconductor substrate 100 in this operation, and FIG. 6B illustrates an impurity concentration distribution in a direction parallel to part of the surface 1000 of the first-conductivity-type semiconductor region.

Figure 6B:
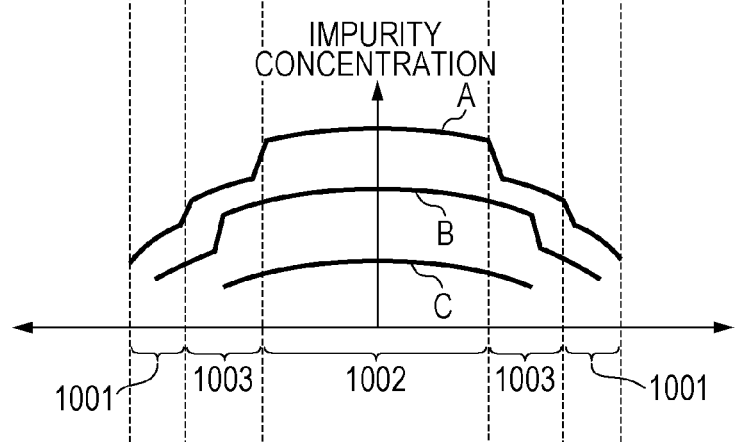
Figure 6C:
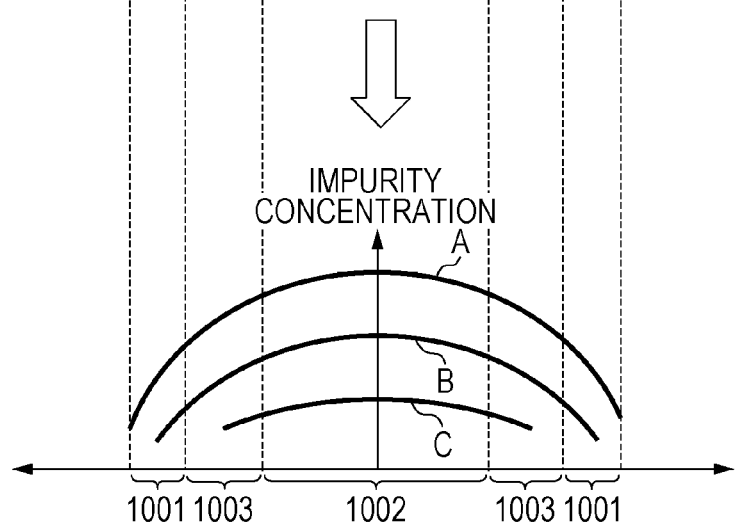

In FIG. 6B, solid lines A, B, and C indicate impurity concentration distributions at corresponding depth positions from the semiconductor substrate 100 side. The solid line A indicates the impurity concentration distribution at the depth indicated by a broken line A in FIG. 6A, the solid line B indicates the impurity concentration distribution at the depth indicated by a broken line B in FIG. 6A, and the solid line C indicates the impurity concentration distribution at the depth indicated by a broken line C in FIG. 6A.

At the depths indicated by the broken line B below the first area 1001 and below the third area 1003, a concentration distribution is generated in the first impurity layer 31 in accordance with the difference in thickness between the first portion 201 and the third portion 203. In this concentration distribution, the impurity concentration of a portion of the first impurity layer 31 which is located below the third area 1003 is higher than the impurity concentration of a portion of the first impurity layer 31 which is located below the first area 1001.

At the depths indicated by the broken line A below the first area 1001 and below the third area 1003, a difference in concentration between the first impurity layer 31 and the second impurity layer 32 occurs in accordance with, in addition to the difference in thickness between the first portion 201 and the third portion 203, the difference in implantation dose between the first ion implantation and the second ion implantation. The difference in concentration is such that the impurity concentration of a portion of the second impurity layer 32 which is located below the third area 1003 is higher than the impurity concentration of a portion of the first impurity layer 31 which is located below the first area 1001.

Similarly, at the depths indicated by the broken line B below the third area 1003 and below the second area 1002, a concentration distribution is generated in the second impurity layer 32 in accordance with the difference in thickness between the third portion 203 and the second portion 202. Also, at the depths indicated by the broken line C below the third area 1003 and below the second area 1002, a concentration distribution is generated in the first impurity layer 31 in accordance with the difference in thickness between the third portion 203 and the second portion 202. Also, at the depths indicated by the broken line A below the third area 1003 and below the second area 1002, a concentration distribution is generated in the third impurity layer 33 in accordance with the difference in thickness between the third portion 203 and the second portion 202.

(Operation i): This operation will be described with reference to FIG. 5A. A fourth mask 240 is formed so as to cover a portion of the second area 1002 and to expose a portion of the second area 1002, the first area 1001, and the third area 1003, and ion implantation is performed. Therefore, a second-conductivity-type surface region 150 is formed. After that, the fourth mask 240 is removed. The implantation energy of ion implantation to form the surface region 150 is typically 1 KeV to 100 KeV if the dopant is B. The dose may be $10^{12}$ to $10^{14}$ ions/cm$^2$.

(Operation j): This operation will be described with reference to FIG. 5B. A fifth mask 250 is formed so as to cover a portion of the second area 1002, the first area 1001, the third area 1003, and the protection area 1005 and to expose a portion of the second area 1002, and ion implantation is performed on the third impurity layer 33. Therefore, a third impurity layer 33' having a first-conductivity-type low-concentration portion 33a and a first-conductivity-type high-concentration portion 33b is formed. After that, the fifth mask 250 is removed. As described with reference to FIG. 4C, the first-conductivity-type low-concentration portion 33a has already been formed as the third impurity layer 33 in the operation h. The operations and j may be performed in reverse order. The implantation energy of ion implantation to form the high-concentration portion 33b is typically 1 KeV to 200 KeV if the dopant is As. The dose may be $10^{12}$ to $10^{15}$ ions/cm$^2$. In the operation i, the buffer film 200 may be formed so as not to cover the second area 1002, and in the operation h, the third impurity layer 33 may be formed so as to have an impurity concentration substantially equal to the high-concentration portion 33b.

(Operation k): This operation will be described with reference to FIG. 5C. An insulating film is formed on the semiconductor substrate 100, and a contact hole is formed in a portion of the insulating film above the second area 1002. A conductor film composed of a metal such as tungsten is deposited on the top of the insulating film so that the contact hole is filled with a conductor. After that, an unnecessary conductor film on the insulating film is removed using a chemical mechanical polishing (CMP) method. Therefore, a contact plug 310 is formed in the contact hole in the interlayer insulating film 320. The interlayer insulating film 320 may be made of silicon oxide, borosilicate glass (BSG), phosphosilicate glass (PSG), or borophosphosilicate glass (BPSG). The high-concentration portion 33b, which has been described in the operation j, may be formed using the interlayer insulating film 320 having the contact hole, rather than the fifth mask 250, as a mask by performing ion implantation through the contact hole.

Prior to the operation k, the amplifier circuit 500 including the amplifier transistor 510, the reset transistor 520, the selection transistor 530, etc., the constant current source, the signal processing circuit 540, and any other suitable device (not illustrated) are formed on the semiconductor substrate 100 using a known forming method. In this operation k, a contact plug to be connected to the gate electrode of the amplifier transistor 510 and the main electrode of the reset transistor 520, which is different from the contact plug 310, is formed.

Connection wiring 330 is formed on the contact plug 310 so as to be connected to the contact plug 310. Therefore, the contact portion 300 having the contact plug 310 and the connection wiring 330 is connected to the second semiconductor region 132 in the first charge generation region 130. In this case, the connection wiring 330 is formed so as to be also connected to the contact plug connected to the gate electrode of the amplifier transistor 510 and the main electrode of the reset transistor 520. Therefore, the contact portion 300 that connects the second semiconductor region 132 to the amplifier circuit 500 is obtained.

(Operation 1): An interlayer insulating film is further formed on the interlayer insulating film 320 to further form a wiring layer on the interlayer insulating film. That is, a multilayer wiring structure is formed. Further, a wavelength selection member that limits the wavelength of energy rays is arranged on the semiconductor substrate 100, if necessary. If the energy rays to be detected are visible light rays, a primary color filter or a complementary color filter may be used as the wavelength selection member. A micro lens may also be arranged on the semiconductor substrate 100, if necessary.

(Operation m): This operation will be described with reference to again FIGS. 6A to 6C. The semiconductor substrate 100 is heated (annealed) to be activated. The temperature required for activation is, for example, 800° C. to 1100° C.

In the state obtained in the operation h, the first impurity layer 31, the second impurity layer 32, and the third impurity layer 33 exhibit an impurity concentration distribution that, as illustrated in FIG. 6B, strongly depends upon the implantation energy. By performing this operation, it is possible to obtain a first charge generation region 130 having a smooth impurity concentration distribution as illustrated in FIG. 6C in which impurities introduced into the semiconductor substrate 100 by ion implantation diffuse appropriately.

More specifically, as described with reference to FIG. 1C, the first impurity layer 31 mainly diffuses to form the first concentration part 1301, the second concentration part 1302 and the third concentration part 1303. Further, the second impurity layer 32 mainly diffuses to form the fourth concentration part 1304 and the fifth concentration part 1305. Further, the third impurity layer 33 mainly diffuses to form the sixth concentration part 1306. The low-concentration portion 1321 and the high-concentration portion 1322 in the sixth concentration part 1306 are formed by the appropriate diffusion of the low-concentration portion 33a and the high-concentration portion 33b formed in the operation j.

This operation may be performed at any timing after the operation h in which ion implantation is carried out through the buffer film 200, and the semiconductor substrate 100 may be repeatedly heated a plurality of times at different timings. The first charge generation region 130 may also be formed of the first impurity layer 31, the second impurity layer 32, and the third impurity layer 33 (or the third impurity layer 33') without activation being performed.

Next, other methods for forming the buffer film 200 according to this embodiment, which are different from the operations f and g described above, will be described with reference to FIGS. 7A to 7D.

Figure 3A:
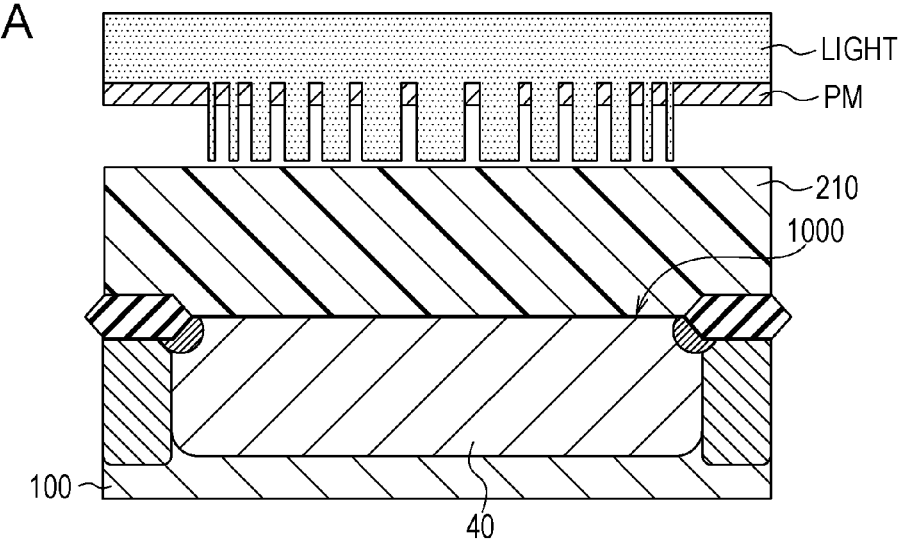
FIGS. 3A and 3B are schematic cross-sectional views illustrating the method (operations f and g) for manufacturing the energy ray detection device according to the first embodiment.
Figure 3B:
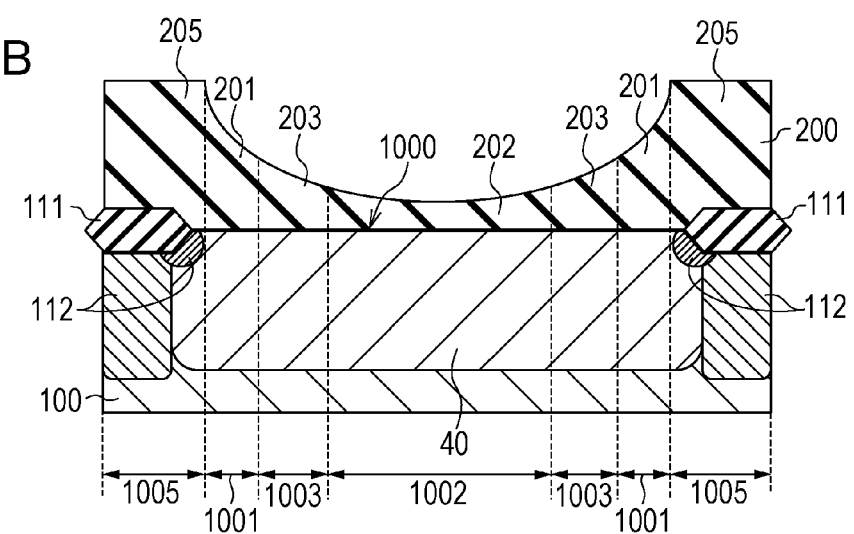
Figure 7A:
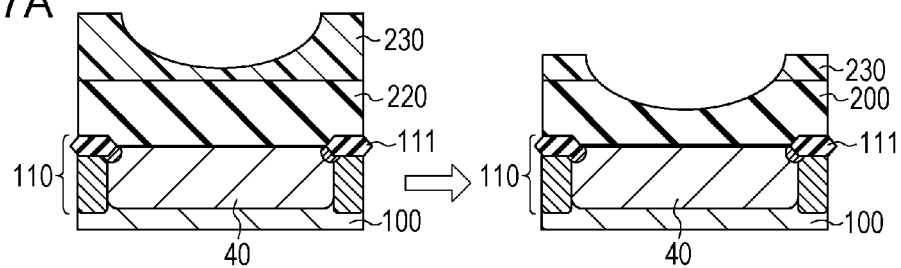
FIGS. 7A to 7D are schematic diagrams illustrating an example of a method of forming a buffer film.
Figure 7B:
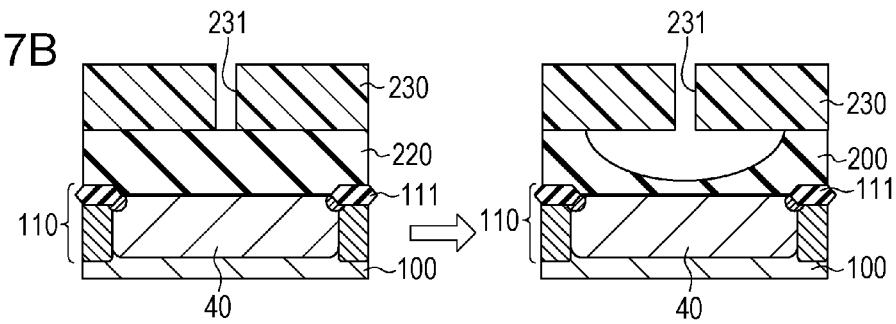
Figure 7C:
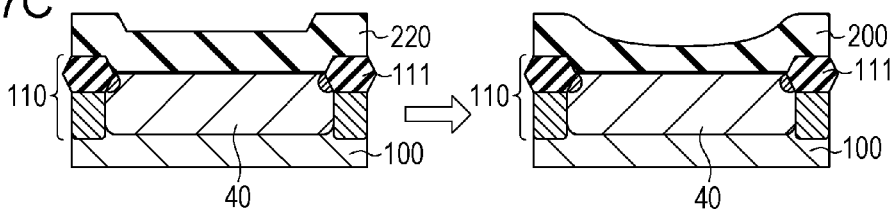

In the example illustrated in FIGS. 3A and 3B, the photosensitive resin film 210 that has been processed is used as the buffer film 200. FIGS. 7A to 7C illustrate an example in which an inorganic insulating film 220 is used as the buffer film 200. In the example illustrated in FIG. 7A, first, the inorganic insulating film 220 is formed so as to cover the well region 40 and the isolation part 110, and the inorganic insulating film 220 is planarized using a technique such as CMP or etch-back. Then, a photosensitive resin film is formed on the inorganic insulating film 220. The photosensitive resin film is exposed and developed using a gradation exposure method in a manner similar to that described with reference to FIGS. 3A and 3B. Therefore, a photosensitive resin film 230 having a thickness distribution is obtained. The photosensitive resin film 230 and the inorganic insulating film 220 are etched using an anisotropic etching method such as plasma etching. In this case, the etching rate for anisotropic etching to be performed on the inorganic insulating film 220 is set to be substantially equal to that for the photosensitive resin film 230 or to be higher than that for the photosensitive resin film 230. Therefore, a thickness distribution that reflects the thickness distribution of the photosensitive resin film 230 obtained by development is generated on the inorganic insulating film 220. The inorganic insulating film 220 having the thus processed thickness distribution may be used as the buffer film 200. The photosensitive resin film 230 used for the processing of the inorganic insulating film 220 is preferably removed, or may be used as a portion of the buffer film 200.

In the example illustrated in FIG. 7B, first, the inorganic insulating film 220 is formed so as to cover the well region 40 and the isolation part 110, and the inorganic insulating film 220 is planarized using a technique such as CMP or etchback. Then, a photosensitive resin film is formed on the inorganic insulating film 220. The photosensitive resin film is patterned using a normal exposure method so as to have a through hole 231. The inorganic insulating film 220 is etched from the through hole 231 using an isotropic etching method such as wet etching or vapor etching, by using as a mask the photosensitive resin film 230 having the through hole 231. Thus, due to underetching immediately below the periphery of the through hole 231 in the photosensitive resin film 230, a thickness distribution occurs in the inorganic insulating film 220. After the photosensitive resin film 230 is removed, the inorganic insulating film 220 having the thickness distribution may be used as the buffer film 200.

In the examples illustrated in FIGS. 7A and 7B, if the inorganic insulating film 220 that covers the semiconductor substrate 100 has a sufficiently high flatness, it is not necessary to planarize the inorganic insulating film 220.

Figure 7D:
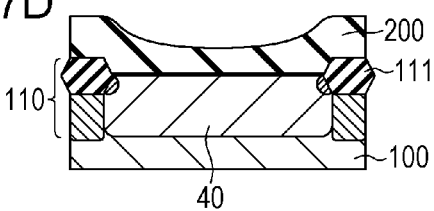

Examples illustrated in FIGS. 7C and 7D may be employed in a case where an isolation part (in the illustrated examples, the isolation insulator 111) projects with respect to the surface of the well region 40, such as when the LOCOS process is used to form the isolation part 110.

In the example illustrated in FIG. 7C, first, the inorganic insulating film 220 is formed so as to cover the well region 40 and the isolation part 110. In this case, the inorganic insulating film 220 has irregularities in accordance with thicknesses of the isolation insulator 111 (silicon oxide film) formed by the LOCOS process. After that, the inorganic insulating film 220 is heated to be flowed (reflowed) to generate a thickness distribution in a portion of the inorganic insulating film 220 above the well region 40. The inorganic insulating film 220 having the thus processed thickness distribution may be used as the buffer film 200.

In the operations f and g, the buffer film 200 is a photosensitive resin film (organic insulating film). However, if ion implantation is performed through the organic insulating film in the operation h, due to the impact of ion implantation, carbon in the organic insulating film may possibly enter and be contained in the semiconductor substrate 100. Such contamination of carbon may reduce the performance of the detection device. In order to address the reduction in performance, as with the above techniques, an inorganic insulating film rather than an organic insulating film is used as the buffer film 200, thereby preventing the contamination of carbon.

In the example illustrated in FIG. 7D, a resin film such as a photosensitive resin film is formed using a coating method so as to cover the well region 40 and the isolation insulator 111. In this case, the viscosity of the resin film is set higher than usual. Therefore, a thickness distribution is generated in a portion of the resin film above the well region 40. The resin film having the thickness distribution may be used as the buffer film 200.

The buffer film 200 having a thickness distribution may also be formed using any method other than the above method. The method of forming the buffer film 200 may also be applied not only to the first embodiment but also to the following second to fifth embodiments.

Second Embodiment

Figure 8A:
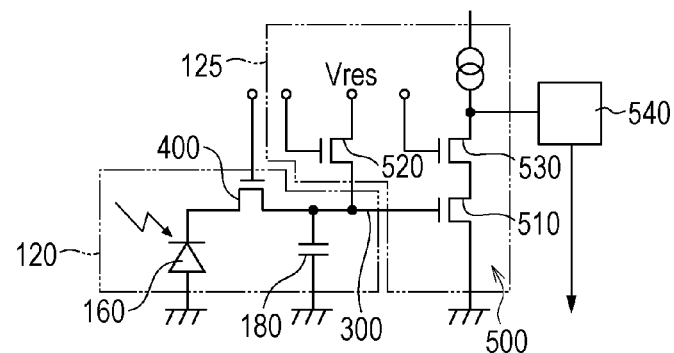
FIG. 8A is an electrical circuit diagram of an energy ray detection device according to a second embodiment.

FIG. 8A is an electrical circuit diagram of a detection device according to a second embodiment. In this embodiment, a capacitor element 180 is connected to a cathode of a charge generation element 160 that is a photodiode through a transfer gate 400, and the capacitor element 180 is connected to a contact portion 300. The configuration of an amplifier circuit 500 and the connection between the contact portion 300 and the amplifier circuit 500 are similar to those in the first embodiment, and descriptions thereof are thus omitted.

The reset transistor 520 is turned on, thereby allowing the potential of the photodiode to be defined to a reset potential Vres. After the reset transistor 520 is turned off, the charge corresponding to the intensity of energy rays is generated in the charge generation element 160, and is accumulated in the charge generation element 160. The transfer gate 400 is turned on, thereby allowing the charge accumulated in the charge generation element 160 to be transferred to the capacitor element 180. The gate electrode of the amplifier transistor 510 connected to the contact portion 300 is defined to the potential corresponding to the amount of charge transferred to the capacitor element 180 via the contact portion 300. The operation of other configuration in the electrical circuit diagram is similar to that in the first embodiment, and a description thereof is thus omitted.

The illustrated electrical circuit is formed as an integrated circuit on a semiconductor substrate. The charge generation element 160 and the capacitor element 180 are disposed in an active part 120 (first active part) of the semiconductor substrate. At least the amplifier transistor 510 of the amplifier circuit 500 is disposed in another active part 125 (second active part) of the semiconductor substrate. The configuration of the amplifier circuit 500 is similar to that in the first embodiment, and a description thereof is thus omitted.

Figure 8B:
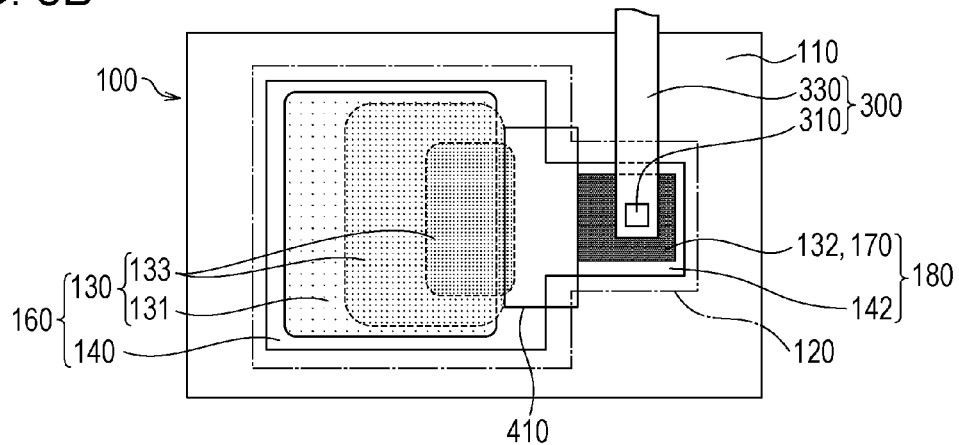
FIG. 8B is a schematic plan view of the energy ray detection device according to the second embodiment.
Figure 8C:
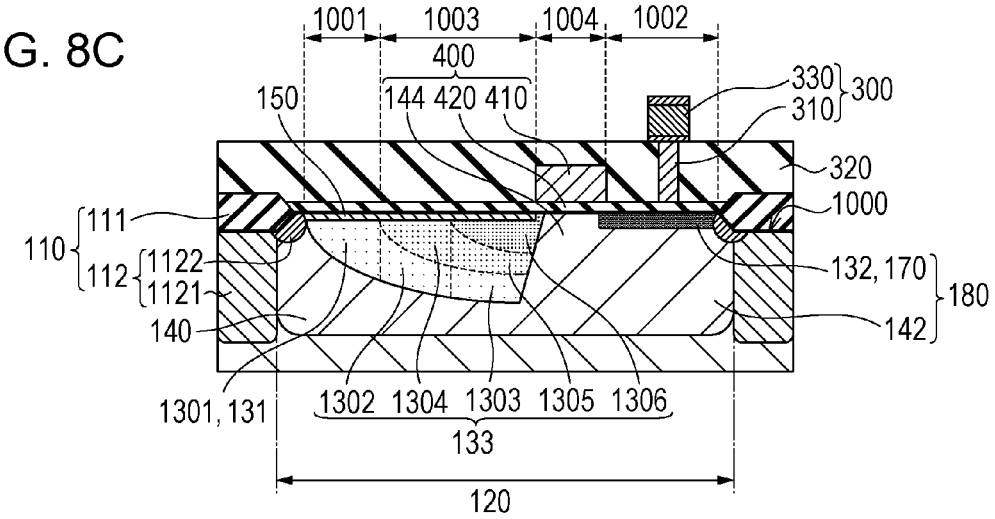
FIG. 8C is a schematic cross-sectional view of the energy ray detection device according to the second embodiment.

FIG. 8B is a schematic plan view of a portion of the active part 120 and its vicinity where the charge generation element 160 is disposed, and FIG. 8C is a schematic cross-sectional view of the vicinity of the active part 120. The active part 120 is disposed below the surface 1000 of the semiconductor substrate 100 (inside the semiconductor substrate 100). In the illustrated example, the charge generation element 160 and the capacitor element 180 occupy the majority of the active part 120, when viewed in plan. The active part 120 will be described hereinafter with cross-reference to FIGS. 8B and 8C.

The charge generation element 160 has a first charge generation region 130 that is a first-conductivity-type semiconductor region, and a second charge generation region 140 that is a second-conductivity-type semiconductor region, and the first charge generation region 130 and the second charge generation region 140 form a PN junction. The first charge generation region 130 is disposed between the surface 1000 of the semiconductor substrate 100 and the second charge generation region 140. Charge generated in the first charge generation region 130 and the second charge generation region 140 is accumulated in the first charge generation region 130. That is, the first charge generation region 130 also functions as an accumulation region.

The capacitor element 180 has a floating diffusion region 170 that is a first-conductivity-type semiconductor region, and a well region 142 that is a second-conductivity-type semiconductor region, and the floating diffusion region 170 and the well region 142 form a PN junction.

The transfer gate 400 has a second-conductivity-type channel region 144, a gate insulating film 420, and a transfer gate electrode 410 composed of polysilicon. Among them, the channel region 144 is disposed as a second-conductivity-type semiconductor region in the active part 120. The transfer gate electrode 410, the gate insulating film 420, and the channel region 144 form a MIS-type gate structure (transfer gate). The term "MIS type" is a general term, and the gate electrode corresponding to "Metal" is not limited to a metal. That is, the transfer gate electrode 410 may be composed of polysilicon, as described above, or metal compound such as nitride as long as the transfer gate electrode 410 is made of a material (conductor) having a conductivity sufficient to form a channel in the channel region 144 (to turn on the transfer gate 400).

The channel region 144 is disposed between the first charge generation region 130 and the floating diffusion region 170. The transfer gate 400 is turned on, thereby allowing a first-conductivity-type channel to be formed in the second-conductivity-type channel region 144, and signal charge is transferred from the first charge generation region 130 to the floating diffusion region 170 via the channel.

The first charge generation region 130 has a first semiconductor region 131 and a third semiconductor region 133, each of which is a first-conductivity-type semiconductor region.

The floating diffusion region 170 has a second semiconductor region 132, which is a first-conductivity-type semiconductor region.

In this manner, the active part 120 has the first semiconductor region 131, the second semiconductor region 132, and the third semiconductor region 133 as first-conductivity-type semiconductor regions.

Here, the surface 1000 of the semiconductor substrate 100 will be described. For convenience of illustration, the surface 1000 is divided into a plurality of areas including a first area 1001, a second area 1002, a third area 1003, and a fourth area 1004. The third area 1003 is located between the first area 1001 and the third area 1003. The fourth area 1004 is located between the third area 1003 and the second area 1002.

In the illustrated example, the third area 1003 is continuous with the first area 1001, and is also continuous with the fourth area 1004. Further, the fourth area 1004 is continuous with the second area 1002.

The first semiconductor region 131 is disposed below the first area 1001, the second semiconductor region 132 is disposed below the second area 1002, and the third semiconductor region 133 is disposed below the third area 1003. The channel region 144 is disposed below the fourth area 1004, and the transfer gate electrode 410 is disposed above the fourth area 1004 through the gate insulating film 420. The third semiconductor region 133 is disposed between the first semiconductor region 131 and the second semiconductor region 132. Therefore, the third semiconductor region 133 may also be referred to as an intermediate semiconductor region. The channel region 144 is disposed between the third semiconductor region 133 and the second semiconductor region 132. In the illustrated example, the third semiconductor region 133 is continuous with the first semiconductor region 131, and adjoins the channel region 144. The second semiconductor region 132 adjoins the channel region 144.

Since the second charge generation region 140, the channel region 144, and the well region 142 are second-conductivity-type semiconductor regions, it may be difficult to distinguish the respective boundaries from each other. However, for convenience, each of the second charge generation region 140, the channel region 144, and the well region 142 may be distinguished from the others by determining below which area on the surface 1000 the region is located.

Here, each of the second semiconductor region 132 and the third semiconductor region 133 adjoins the channel region 144, by way of example. However, a first-conductivity-type semiconductor region having a lower impurity concentration than the third semiconductor region 133 may be disposed between the channel region 144 and the third semiconductor region 133. Likewise, a first-conductivity-type semiconductor region having a lower impurity concentration than the second semiconductor region 132 may be disposed between the channel region 144 and the second semiconductor region 132. The low-impurity-concentration first-conductivity-type semiconductor regions disposed in the vicinity of the channel region 144 are generally referred to as lightly doped drain (LDD) regions.

The first charge generation region 130 will be described in more detail.

The first charge generation region 130 includes a first concentration part 1301, a second concentration part 1302, a third concentration part 1303, a fourth concentration part 1304, a fifth concentration part 1305, and a sixth concentration part 1306, each of which is a first-conductivity-type semiconductor region.

The first semiconductor region 131 has the first concentration part 1301. The first concentration part 1301 and the second charge generation region 140 form a PN junction.

The second semiconductor region 132 includes the third concentration part 1303, the fifth concentration part 1305, and the sixth concentration part 1306 in this order from the second charge generation region 140 side toward the second area 1002 side. The second semiconductor region 132 and the well region 142 form a PN junction.

The third semiconductor region 133 includes the second concentration part 1302 and the fourth concentration part 1304 in this order from the second charge generation region 140 side toward the third area 1003 side. The third semiconductor region 133 further includes the third concentration part 1303, the fifth concentration part 1305, and the sixth concentration part 1306 in this order from the second charge generation region 140 side toward the third area 1003 side. The second concentration part 1302 and the second charge generation region 140 form a PN junction, and the third concentration part 1303 and the second charge generation region 140 form a PN junction.

The impurity concentrations of the first to sixth concentration parts 1301 to 1306 will be described. The impurity concentrations of the fourth concentration part 1304 and the fifth concentration part 1305 are higher than the impurity concentrations of the first concentration part 1301, the second concentration part 1302, and the third concentration part 1303, and are lower than the impurity concentration of the sixth concentration part 1306.

The first concentration part 1301, the second concentration part 1302, and the third concentration part 1303 have substantially the same impurity concentration. However, preferably, the impurity concentration of the third concentration part 1303 is higher than the impurity concentration of the first concentration part 1301, and the impurity concentration of the second concentration part 1302 is between the impurity concentration of the first concentration part 1301 and the impurity concentration of the third concentration part 1303.

Further, the fourth concentration part 1304 and the fifth concentration part 1305 have substantially the same impurity concentration. However, preferably, the impurity concentration of the fifth concentration part 1305 is higher than the impurity concentration of the fourth concentration part 1304.

In summary, the impurity concentrations of the first to sixth concentration parts 1301 to 1306 satisfy the relationship of first concentration part 1301≤second concentration part 1302≤third concentration part 1303<<fourth concentration part 1304≤fifth concentration part 1305<<sixth concentration part 1306.

Also in this embodiment, as in the first embodiment, the charge generation element 160 has a surface region 150 that is a second-conductivity-type semiconductor region between the surface 1000 of the semiconductor substrate 100 and the first charge generation region 130. Also, as in the first embodiment, the second charge generation region 140 may have a plurality of second-conductivity-type semiconductor regions with different impurity concentrations. The configuration of the isolation part 110 is similar to that in the first embodiment, and a description thereof is thus omitted.

In this embodiment, the contact portion 300 is connected to the second semiconductor region 132, which is at least a portion of the floating diffusion region 170. As in the first embodiment, the contact portion 300 may include the contact plug 310 and the connection wiring 330, and a detailed description thereof is thus omitted. The second semiconductor region 132 to which the contact plug 310 is connected may have an impurity concentration of $10^{15}$ to $10^{20}$ atoms/cm$^3$.

The charge generated in the first charge generation region 130 moves in the first charge generation region 130 in accordance with a potential distribution produced in the first charge generation region 130. According to this embodiment, the impurity concentrations of the first-conductivity-type first semiconductor region 131 and the first-conductivity-type third semiconductor region 133 increase when coming closer to the second semiconductor region 132 to which the contact portion 300 is connected. For this reason, a potential distribution resulting from the impurity concentration distribution is produced in the first charge generation region 130. In the potential distribution, the potential of the third semiconductor region 133 is higher than the potential of the second semiconductor region 132. This allows the signal charge existing at a certain position in the first charge generation region 130 to easily move toward the contact portion 300 through the channel formed in the channel region 144. Therefore, the signal charge generated in the charge generation element 160 may be quickly and efficiently collected in the vicinity of the contact portion 300, and the accuracy with which the potential appearing at the gate electrode of the amplifier transistor 510 by signal charge is detected may be increased. As a result, a detection device capable of detecting energy rays more accurately than a detection device in which the first charge generation region 130 has no impurity concentration distributions may be obtained.

A method for manufacturing a detection device having the above configuration will be described hereinafter focusing on, in particular, a method for forming the active part 120. The detection device according to this embodiment may be manufactured using similar operations up to the operations a to e described in the first embodiment. Thus, descriptions of the operations a to e are omitted, and operations n to t, which are performed after the operation e in place of the operations f to m in the first embodiment, will be described.

Figure 9A:
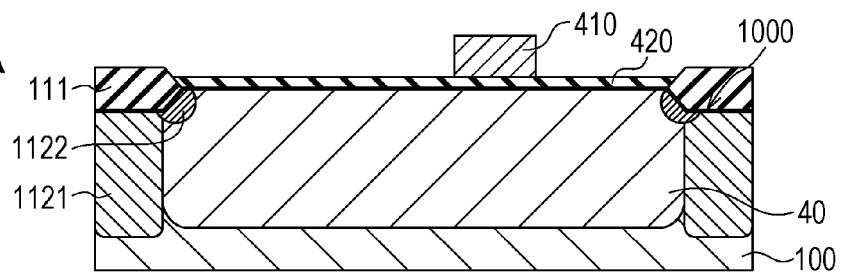
FIGS. 9A to 9C are schematic cross-sectional views illustrating a method (operations n to p) for manufacturing the energy ray detection device according to the second embodiment.

(Operation n): This operation will be described with reference to FIG. 9A. A gate insulating film 420 is formed on the well region 40 using dry oxidation (thermal oxidation) or wet oxidation. A polysilicon film is deposited on the top of the gate insulating film 420, and the polysilicon film is patterned in the shape of the transfer gate electrode 410 using a photolithography technique and an etching technology technique.

Figure 9B:
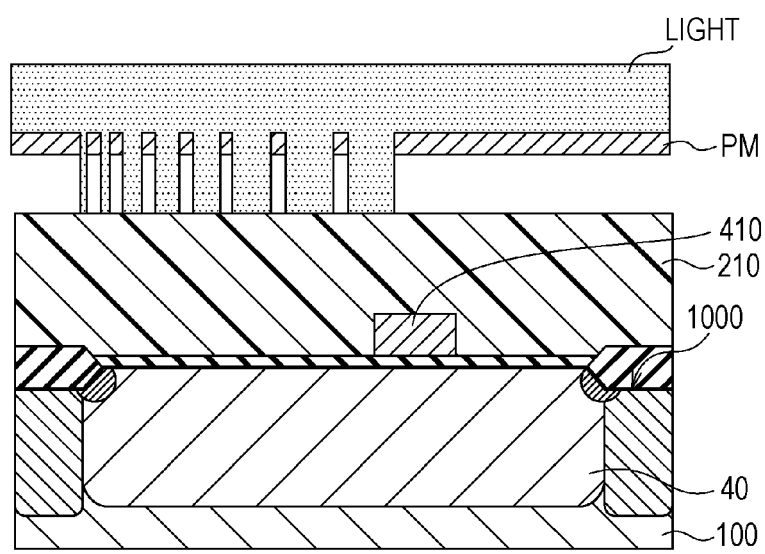

(Operation o): This operation will be described with reference to FIG. 9B. A photosensitive resin film 210 is formed on the gate insulating film 420 and the transfer gate electrode 410 so as to cover the surface 1000 of the semiconductor substrate 100. The photosensitive resin film 210 is exposed to light by a gradation exposure method. In the illustrated example, a positive type resist is used; however, a negative type resist may be used.

Figure 9C:
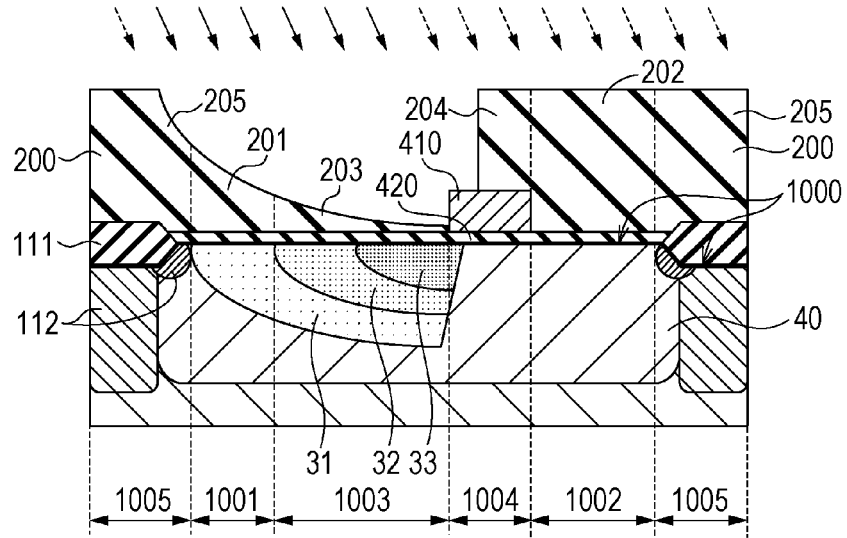

(Operation p): This operation will be described with reference to FIG. 9C. The photosensitive resin film 210 exposed to light in the operation o is developed to form a buffer film 200 having a thickness distribution. Thus, the buffer film 200 having a thickness distribution is formed as illustrated in FIG. 9C in accordance with the amount of light to which the photosensitive resin film 210 is exposed during the gradation exposure performed in the operation o. Since the positive type photosensitive resin film 210 is used in the operation o, a portion exposed to a large amount of light during gradation exposure becomes thin when developed.

Here, for convenience of description of the operation p and the subsequent operations q and r, the surface 1000 is divided into a plurality of areas including a first area 1001, a second area 1002, a third area 1003, a fourth area 1004, and a protection area 1005. The third area 1003 is located between the first area 1001 and the third area 1003. The fourth area 1004 is located between the third area 1003 and the second area 1002.

In the illustrated example, the third area 1003 is continuous with the first area 1001, and is also continuous with the fourth area 1004. Further, the fourth area 1004 is continuous with the second area 1002.

The buffer film 200 covers the surface 1000 of the semiconductor substrate 100. Here, for convenience of description of the operation p, the buffer film 200 is divided into a plurality of portions including a first portion 201, a second portion 202, a third portion 203, a fourth portion 204, and a protection portion 205. The first portion 201 covers the first area 1001, the second portion 202 covers the second area 1002, and the third portion 203 covers the third area 1003. The fourth portion 204 covers a portion of the fourth area 1004, and the protection portion 205 covers the protection area 1005. The second-conductivity-type well region 40 is located below the first portion 201 and the first area 1001, below the second portion 202 and the second area 1002, below the third portion 203 and the third area 1003, and below the fourth portion 204 and the fourth area 1004. The transfer gate electrode 410 and the gate insulating film 420 are located between the fourth portion 204 and the fourth area 1004, and the fourth portion 204 covers a portion of the transfer gate electrode 410. An isolation region 112 is located immediately below the protection portion 205 and the protection area 1005. An isolation insulator 111 is located between the protection portion 205 and the protection area 1005, and the protection portion 205 covers the isolation insulator 111.

The third portion 203 is located between the first portion 201 and the second portion 202. The fourth portion 204 is located between the third portion 203 and the second portion 202. In the illustrated example, the third portion 203 is continuous with the first portion 201, and the fourth portion 204 is continuous with the second portion 202. The protection portion 205 is continuous with the first portion 201 and is also continuous with the second portion 202.

Through development, the thickness of the third portion 203 is made smaller than the thickness of the first portion 201. Further, the thickness of the second portion 202 is made larger than the thickness of the third portion 203. The thickness of the protection portion 205 is made larger than the thickness of the first portion 201. In the illustrated example, the thicknesses of the first portion 201 and the third portion 203 continuously change, and form a recessed surface with a monotonically decreasing thickness in this order. In the preceding operation o, gradation exposure is performed so that the above thickness distribution is obtained through development.

As described above, an LDD region may be disposed. In this case, the LDD region is formed by, for example, performing ion implantation at a low dose before the buffer film 200 is formed. After that, a side spacer that covers a side wall of the gate electrode is formed on an end portion of the third area 1003, and the buffer film 200 is further formed.

After the buffer film 200 is formed, as in the operation h in the first embodiment, ion implantation is performed on the well region 40 through the buffer film 200. Therefore, the first charge generation region 130 is formed. Also in the illustrated example, ion implantation is performed three times. FIG. 9C illustrates third ion implantation that is the ion implantation for the third time after first ion implantation that is the ion implantation for the first time and second ion implantation that is the ion implantation for the second time.

The second ion implantation is carried out with implantation energy lower than the first ion implantation, and the third ion implantation is carried out with implantation energy lower than the second ion implantation. The first charge generation region 130 may be formed by single ion implantation through the buffer film 200 having a thickness distribution, but is desirably formed by performing ion implantation a plurality of times with different implantation energies as in the above manner. In addition, the doses (beam currents) in ion implantation performed a plurality of times with different implantation energies may differ. In the illustrated example, the second ion implantation is performed at a dose higher than the first ion implantation, and the third ion implantation is performed at a dose higher than the second ion implantation. The first charge generation region 130 may be formed using a single implantation dose through the buffer film 200 having a thickness distribution, but is desirably formed by performing ion implantation a plurality of times at different doses as in the above manner.

In FIG. 9C, the trajectories of ions in the first to third ion implantations are indicated by arrows. Solid line arrows indicate the trajectories of the ions to be implanted into the well region 40, and broken line arrows indicate the trajectories of the ions not implanted due to the obstruction of the buffer film 200.

In the first ion implantation, the protection portion 205, the second portion 202, and the fourth portion 204 of the buffer film 200 function as masks. In contrast, ions are implanted into the well region 40 through the first portion 201 and the third portion 203, which are thinner than the protection portion 205. The ions pass through the first area 1001 and the third area 1003 while no ions pass through the protection area 1005, the second area 1002, and the fourth area 1004. Therefore, a first-conductivity-type first impurity layer 31 is formed below the first portion 201 and the first area 1001, and below the third portion 203 and the third area 1003.

In the second ion implantation, the first portion 201, the second portion 202, the fourth portion 204, and the protection portion 205 of the buffer film 200 function as masks. In contrast, ions are implanted into the well region 40 through the third portion 203. The ions pass through the third area 1003 while no ions pass through the protection area 1005, the first area 1001, the second area 1002, and the fourth area 1004. Therefore, a first-conductivity-type second impurity layer 32 is formed below the third portion 203 and the third area 1003. Below the third portion 203, the second impurity layer 32 is formed at a position shallower than the first impurity layer 31.

In the third ion implantation, a comparatively thick portion of the third portion 203, the protection portion 205, the first portion 201, the second portion 202, and the fourth portion 204 of the buffer film 200 function as masks. In contrast, ions are implanted into the well region 40 through a comparatively thin portion of the third portion 203. The ions pass through a portion of the third area 1003 while no ions pass through a portion of the third area 1003, the protection area 1005, the first area 1001, the second area 1002, and the fourth area 1004. Therefore, a first-conductivity-type third impurity layer 33 is formed below a portion of the third portion 203 and the third area 1003. Below a portion of the third portion 203, the third impurity layer 33 is formed at a position shallower than the second impurity layer 32.

The implantation conditions of ion implantation in this operation are similar to those in the operation h in the first embodiment, and descriptions thereof are thus omitted.

In the third ion implantation, preferably, oblique ion implantation is used so that the third impurity layer 33 encroaches beneath the fourth area 1004, that is, beneath the transfer gate electrode 410. Oblique ion implantation may also be used in the first ion implantation and the second ion implantation.

Figure 10A:
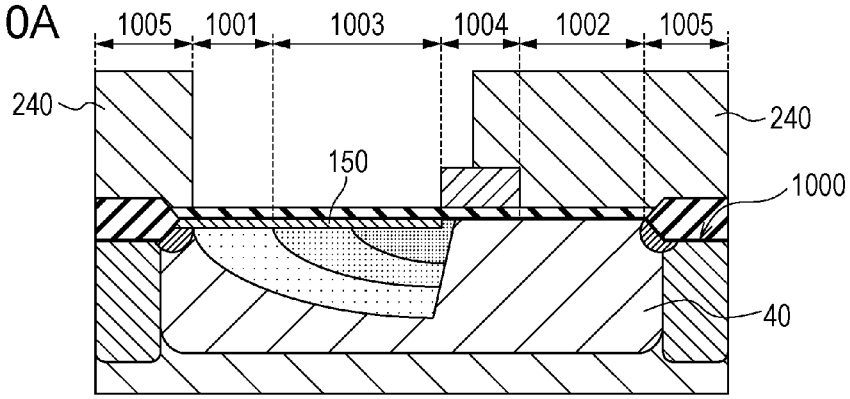
FIGS. 10A to 10C are schematic cross-sectional views illustrating the method (operations q to s) for manufacturing the energy ray detection device according to the second embodiment.

(Operation q): This operation will be described with reference to FIG. 10A. A fourth mask 240 is formed so as to cover the second area 1002, the fourth area 1004, and the protection area 1005 and to expose the first area 1001 and the third area 1003, and ion implantation is performed. Therefore, a second-conductivity-type surface region 150 is formed. After that, the fourth mask 240 is removed.

Figure 10B:
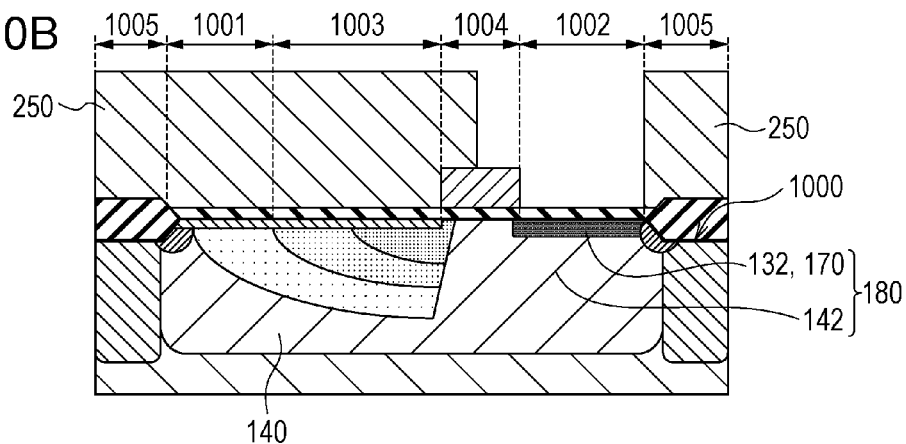

(Operation r): This operation will be described with reference to FIG. 10B. A fifth mask 250 is formed so as to cover the first area 1001, the third area 1003, the protection area 1005, and the fourth area 1004 and to expose the second area 1002, and ion implantation is performed on the well region 40. Therefore, a floating diffusion region 170 having the second semiconductor region 132, which is a first-conductivity-type semiconductor region, is formed. After that, the fifth mask 250 is removed. The implantation energy of ion implantation to form the floating diffusion region 170 is typically 1 KeV to 200 KeV if the dopant is As. The dose may be $10^{12}$ to $10^{15}$ ions/cm$^2$.

While the operations p, q, and r are preferably performed in this order, the operations p, q, and r may be reordered.

Figure 10C:
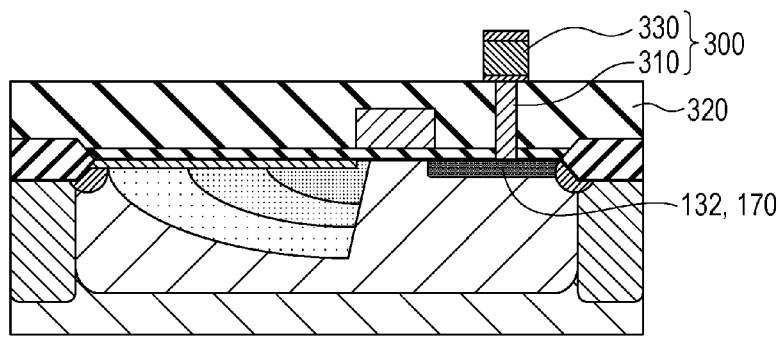

(Operation s): This operation will be described with reference to FIG. 10C. An insulating film is formed on the semiconductor substrate 100, and a contact hole is formed in a portion of the insulating film above the second area 1002. A metal film such as a tungsten film is deposited on the top of the insulating film so that the contact hole is filled with a metal. After that, an unnecessary metal film on the insulating film is removed using a CMP method. Therefore, a contact plug serving as the contact plug 310 is formed in the contact hole in the interlayer insulating film 320. Connection wiring 330 is formed on the contact plug so as to be connected to the contact plug. Therefore, the contact portion 300 having the contact plug 310 and the connection wiring 330 is connected to the second semiconductor region 132 in the capacitor element 180. Other features are similar to those of the first embodiment, and a description thereof is thus omitted.

(Operation t): This operation may be similar to the operations l and m in the first embodiment. In this embodiment, due to being activated, the impurities in the first impurity layer 31, the second impurity layer 32, and the third impurity layer 33 diffuse appropriately, and the first charge generation region 130 having the first to sixth concentration parts 1301 to 1306 is formed. More specifically, as described with reference to FIG. 8C, the first impurity layer 31 mainly diffuses to form the first concentration part 1301, the second concentration part 1302, and the third concentration part 1303. Further, the second impurity layer 32 mainly diffuses to form the fourth concentration part 1304 and the fifth concentration part 1305. Further, the third impurity layer 33 mainly diffuses to form the sixth concentration part 1306.

Third Embodiment

Figure 11A:
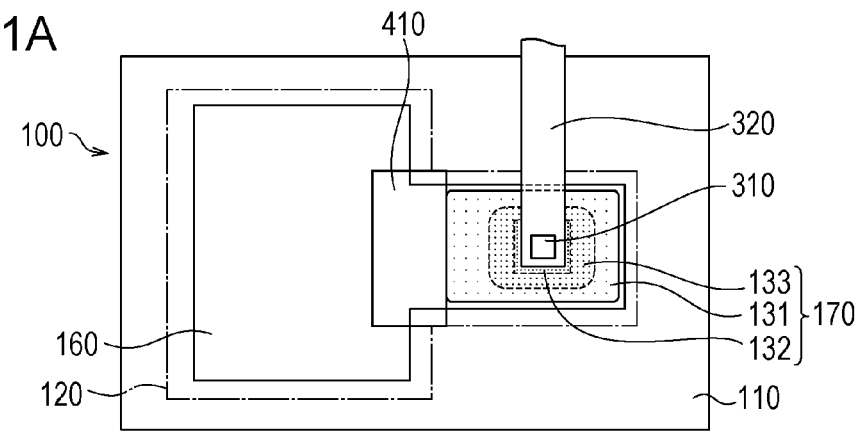
FIG. 11A is a schematic plan view of an energy ray detection device according to a third embodiment.
Figure 11B:
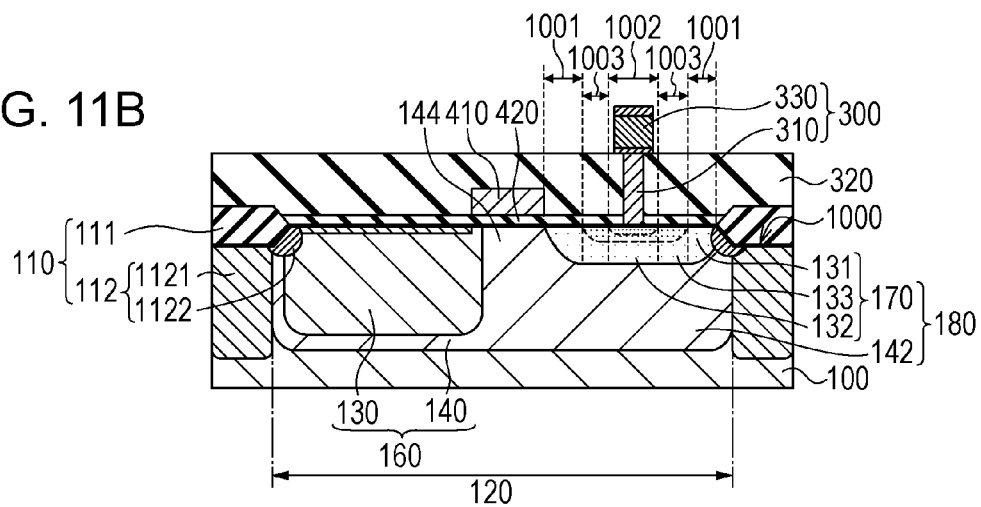
FIG. 11B is a schematic cross-sectional view of the energy ray detection device according to the third embodiment.

This embodiment provides an example in which the floating diffusion region 170 is formed by performing ion implantation through the buffer film 200 using a configuration similar to that in the second embodiment. FIG. 11A is a schematic plan view of the active part 120, and FIG. 11B is a schematic cross-sectional view of the active part 120.

The first-conductivity-type floating diffusion region 170 includes a first semiconductor region 131, a second semiconductor region 132, and a third semiconductor region 133. Similarly to the second embodiment, the surface 1000 of the semiconductor substrate 100 may be divided into a plurality of areas including a first area 1001, a second area 1002, and a third area 1003. The first semiconductor region 131 is disposed below the first area 1001, the second semiconductor region 132 is disposed below the second area 1002, and the third semiconductor region 133 is disposed below the third area 1003. The third area 1003 is located between the first area 1001 and the second area 1002, and the third semiconductor region 133 is located between the first semiconductor region 131 and the second semiconductor region 132. The contact portion 300 is connected to the second semiconductor region 132.

A charge generation element 160 having a first-conductivity-type first charge generation region 130 and a second-conductivity-type second charge generation region 140 is disposed in the active part 120. A second-conductivity-type channel region 144 is disposed between the first charge generation region 130 and the floating diffusion region 170.

A detection device according to this embodiment may be manufactured by operations similar to the operations a to e described in the first embodiment, and descriptions of the operations a to e are thus omitted. In addition, the detection device may be manufactured using similar operations up to the operations n to q described in the second embodiment, and descriptions of the operations n to q are thus omitted. In this embodiment, an operation u different from the operation r in the second embodiment is used. In this embodiment, however, the buffer film 200 having a film thickness distribution may not necessarily be used in the operations o to q. That is, as is known in the art, the surface 1000 of the semiconductor substrate 100 may be exposed in a portion where the first charge generation region 130 is to be formed, and the first charge generation region 130 may be formed by single ion implantation.

Figure 11C:
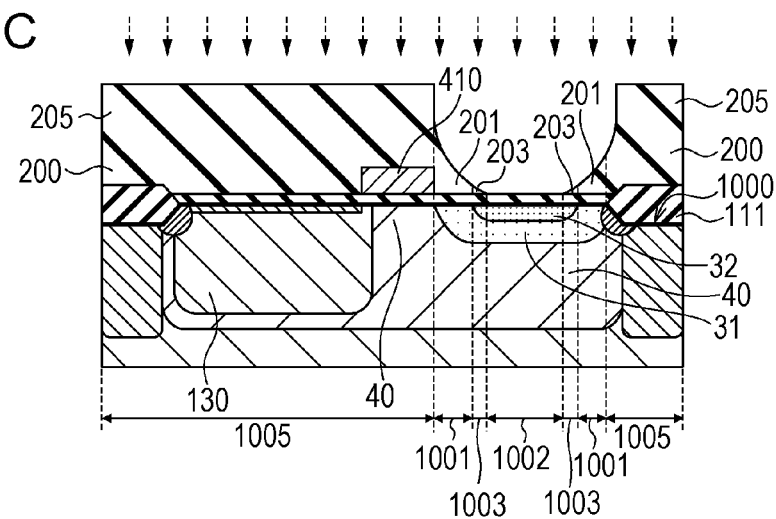
FIG. 11C is a schematic cross-sectional view illustrating a method (operation u) for manufacturing the energy ray detection device according to the third embodiment.

(Operation u): This operation will be described with reference to FIG. 11C. FIG. 11C is a schematic cross-sectional view of an operation of forming the floating diffusion region 170. After the first charge generation region 130 is formed, a buffer film 200 having a thickness distribution is formed. The buffer film 200 does not cover the second area 1002 on the surface 1000 of the semiconductor substrate 100 but covers the first area 1001, the third area 1003, and the protection area 1005. Ion implantation is performed through the buffer film 200. In the illustrated example, ion implantation is performed twice. FIG. 11C illustrates second ion implantation that is the ion implantation for the second time after first ion implantation that is the ion implantation for the first time. The second ion implantation is carried out with implantation energy lower than the first ion implantation. Further, the second ion implantation is carried out at a dose higher than the first ion implantation.

In the first ion implantation, the protection portion 205 functions as a mask. In contrast, ions in the first ion implantation are implanted into the well region 40 through the first portion 201 and the third portion 203. The ions pass through the first area 1001, the second area 1002, and the third area 1003. Therefore, a first impurity layer 31 is formed. In the second ion implantation, the protection portion 205 and the first portion 201 function as masks. In contrast, ions in the second ion implantation are implanted into the well region 40 through the third portion 203. The ions pass through the second area 1002 and the third area 1003. Therefore, a second impurity layer 32 is formed.

(Operation v): After the operation u, an insulating film is formed on the semiconductor substrate 100, and the insulating film is etched to form a contact hole at a position in the floating diffusion region 170 corresponding to the first semiconductor region 131. A conductor film is deposited on the top of the insulating film so that the contact hole is filled with a conductor. After that, an unnecessary conductor film on the insulating film is removed using a CMP method. Therefore, a contact plug 310 to be connected to the first semiconductor region 131 is formed in the contact hole. Connection wiring 330 is formed on the top of the contact plug 310 so as to be connected to the contact plug 310. Prior to the operation v, the reset transistor 520, the amplifier transistor 510, the selection transistor 530, the constant current source, the signal processing circuit 540, and any other suitable device (not illustrated) are formed on the semiconductor substrate 100 using a known forming method. Through this operation, the connection wiring 330 is connected to the gate electrode of the amplifier transistor 510 and the main electrode of the reset transistor 520. The subsequent operations may be similar to the operations l and m in the first embodiment.

In this embodiment, a portion of the first impurity layer 31 which is located below the first area 1001 forms the first semiconductor region 131 due to appropriate diffusion. A portion of the first impurity layer 31 and the second impurity layer 32 which is located below the third area 1003 forms the third semiconductor region 133 due to appropriate diffusion. A portion of the first impurity layer 31 and the second impurity layer 32 which is located below the second area 1002 forms the second semiconductor region 132 due to appropriate diffusion. Then, the first semiconductor region 131 is connected to the contact portion 300. A portion of the second impurity layer 32 which is located below the second area 1002 is not covered by the buffer film 200, and thus has a higher concentration than the remaining portion of the second impurity layer 32. Therefore, it is desirable that the contact portion 300 be connected to this high-concentration portion.

Fourth Embodiment

Figure 12A:
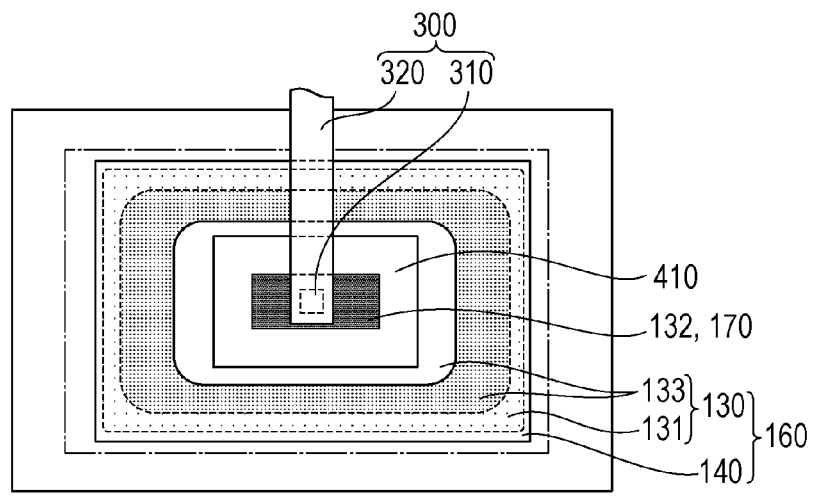
FIG. 12A is a schematic plan view of an energy ray detection device according to a fourth embodiment.
Figure 12B:
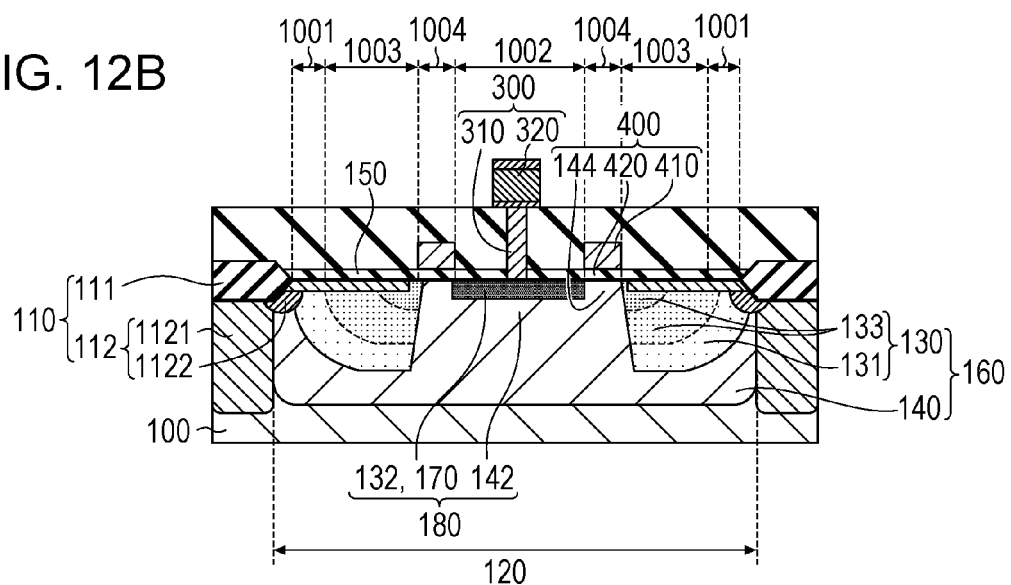
FIG. 12B is a schematic cross-sectional view of the energy ray detection device according to the fourth embodiment.

This embodiment provides an example in which a function for transferring signal charge in a manner similar to that in the second embodiment is added to the first embodiment. An electrical circuit diagram of this embodiment is substantially the same as that of the second embodiment described with reference to FIG. 8A, and a description thereof is thus omitted. FIG. 12A is a schematic plan view of the active part 120, and FIG. 12B is a schematic cross-sectional view of the active part 120.

This embodiment is different from the second embodiment in that the first area 1001 surrounds the third area 1003, and the fourth area 1004 and the second area 1002 are surrounded by the third area 1003. This embodiment is further different from the second embodiment in that the first semiconductor region 131 surrounds the third semiconductor region 133, and the channel region 144 and the floating diffusion region 170 are surrounded by the third semiconductor region 133. On the other hand, this embodiment is similar to the second embodiment in that, for example, in the structure of the active part 120, the floating diffusion region 170 has a second semiconductor region 132 and the contact portion 300 is connected to the second semiconductor region 132, which will not be described herein. A contact plug 310 included in the contact portion 300 is surrounded by a transfer gate electrode 410. As in the second embodiment, an LDD region may be disposed.

A method for manufacturing a detection device according to this embodiment will be described with reference to FIG. 12C. Since the method is not largely different from the manufacturing method according to the second embodiment, only features different from those in the second embodiment will be described. Specifically, an operation w described below replaces the operation p in the second embodiment. In the operation n in the second embodiment, a gate electrode composed of polysilicon is formed in a loop shape.

(Operation w): This operation will be described with reference to FIG. 12C. In FIG. 12C, the buffer film 200 covers a surface of the semiconductor substrate 100. More specifically, a first portion 201 covers the first area 1001, a second portion 202 covers the second area 1002, a third portion 203 covers a portion of the third area 1003, and a protection portion 205 covers the protection area 1005. A fourth portion 204 covers a portion of the fourth area 1004. In the illustrated example, the buffer film 200 does not cover a portion of the third area 1003, and the portion of the third area 1003 is exposed. The third portion 203 may cover the entire third area 1003. The fourth area 1004 is covered by a transfer gate electrode. The protection area 1005 includes the surface 1000 of the isolation insulator 111 of the isolation part 110. The third area 1003 is located between the first area 1001 and the second area 1002, and is continuous with the first area 1001. In this embodiment, the third area 1003 is spaced apart from the second area 1002, and the fourth area 1004 is located between the second area 1002 and the third area 1003. In the illustrated example, the fourth area 1004 is continuous with the second area 1002, and is also continuous with the third area 1003. Further, the protection area 1005 adjoins the first area 1001. In this embodiment, the thickness of the third portion 203 is smaller than the thickness of the first portion 201. Further, the thicknesses of the second portion 202 and the fourth portion 204 are larger than the thickness of the first portion 201. Further, the thickness of the protection portion 205 is larger than the thickness of the first portion 201. In the illustrated example, the thicknesses of the first portion 201 and the third portion 203 continuously change, and form a shape with a monotonically decreasing thickness in this order.

As in the operation h in the first embodiment, ion implantation is performed on the semiconductor substrate 100 through the buffer film 200. In the illustrated example, ion implantation is performed twice. FIG. 12C illustrates second ion implantation that the ion implantation for the second time after first ion implantation that is the ion implantation for the first time.

The second ion implantation is carried out with implantation energy lower than the first ion implantation. The first charge generation region 130 may be formed by single ion implantation through the buffer film 200 having a thickness distribution, but is desirably formed by performing ion implantation a plurality of times with different implantation energies as in the above manner. In addition, the doses (beam currents) in ion implantation performed a plurality of times with different implantation energies may differ. In the illustrated example, the second ion implantation is performed at a dose higher than the first ion implantation. The first charge generation region 130 may be formed using a single implantation dose through the buffer film 200 having a thickness distribution, but is desirably formed by performing ion implantation a plurality of times at different doses as in the above manner.

Figure 12C:
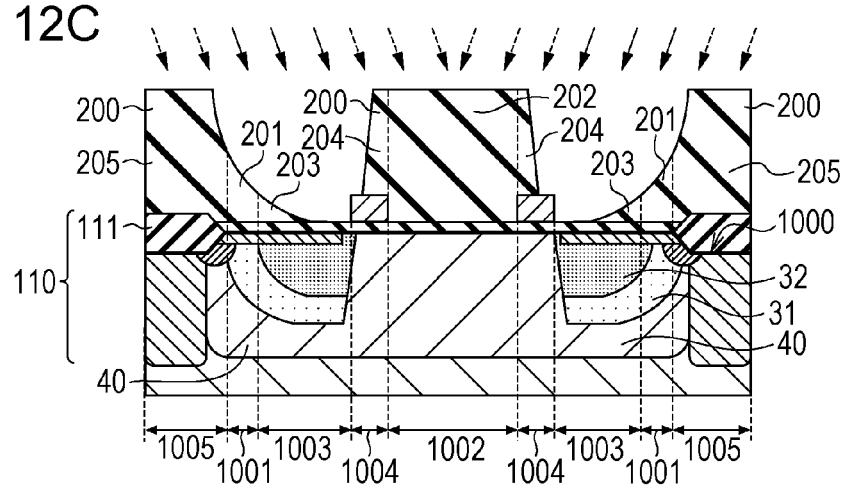
FIG. 12C is a schematic cross-sectional view illustrating a method (operation w) for manufacturing the energy ray detection device according to the fourth embodiment.

In FIG. 12C, the trajectories of ions in the first and second ion implantations are indicated by arrows. Solid line arrows indicate the trajectories of the ions to be implanted into the second charge generation region 140, and broken line arrows indicate the trajectories of the ions not implanted due to the obstruction of the buffer film 200.

In the first ion implantation, the protection portion 205, the second portion 202, and the fourth portion 204 of the buffer film 200 function as masks. In contrast, ions are implanted into the well region 40 through the first portion 201 and the third portion 203. The ions pass through the first area 1001 and the third area 1003. Therefore, a first-conductivity-type first impurity layer 31 is formed.

In the second ion implantation, the protection portion 205, the first portion 201, the second portion 202, and the fourth portion 204 of the buffer film 200 function as masks. In contrast, ions are implanted into the well region 40 through the third portion 203, which is thinner than the second portion 202. The ions pass through the third area 1003. Therefore, a first-conductivity-type second impurity layer 32 is formed. Below the third area 1003, the second impurity layer 32 is formed at a position shallower than the first impurity layer 31.

In the second ion implantation, preferably, oblique ion implantation is used so that the second impurity layer 32 encroaches beneath the fourth area 1004, that is, beneath the transfer gate electrode. Oblique ion implantation may also be used in the first ion implantation. In addition, when the second impurity layer 32 is made to encroach beneath the entire periphery of the transfer gate electrode, rotation ion implantation may be used in which the semiconductor substrate 100 is rotated and ion implantation is performed in a plurality of directions. In this case, ion implantation may be performed while the semiconductor substrate 100 is rotated, or the start and stop of ion implantation may be repeated each time the orientation of the semiconductor substrate 100 is changed.

After this operation, the buffer film 200 is removed, and ion implantation is performed in a manner similar to that in the operation r in the second embodiment so that ions pass through the second area 1002 to form a second semiconductor region 132. The subsequent operations may be similar to those in the second embodiment, and a description thereof is thus omitted.

Fifth Embodiment

This embodiment provides an example in which the disclosure is applied to a detection device having a wavelength conversion member (scintillator) for detecting radiation rays. In particular, the present embodiment is suitably applied to an X-ray imaging device that detects typical X-rays of 2 to 20 keV and that outputs an image. It is to be understood that a detection device having no scintillators is also capable of detecting radiation rays applied to the charge generation element 160 to generate signal charge, such as soft X-rays.

Figure 13A:
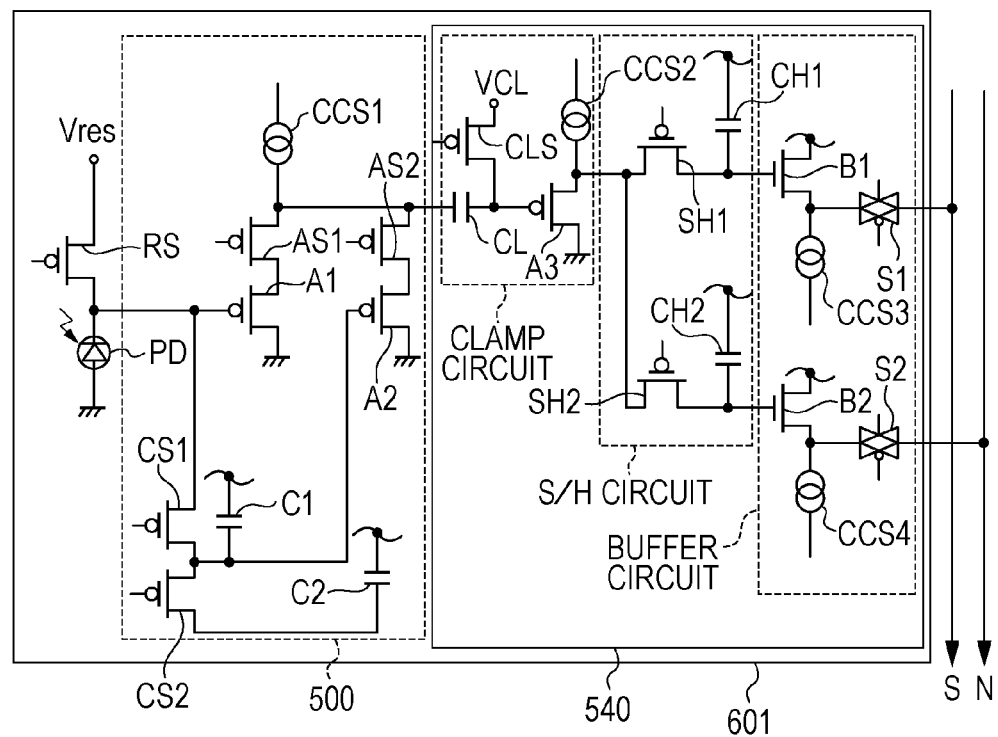
FIG. 13A is an electrical circuit diagram of an energy ray detection device according to a fifth embodiment.

FIG. 13A is an electrical circuit diagram of a detection device according to the fifth embodiment. Multiple pixels 601, each of which is formed of an electrical circuit (pixel circuit) illustrated in FIG. 13A, are arranged in a two-dimensional array. Each of the pixel circuits is connected to a photodiode PD serving as a charge generation element, and includes a reset transistor RS, an amplifier circuit 500, a clamp circuit, a sample-and-hold (S/H) circuit, and a buffer circuit. The clamp circuit, the S/H circuit, and the buffer circuit are included in a signal processing circuit 540.

A description will be given of the amplifier circuit 500. At least one of the gate width and the gate length of one of a first amplifier transistor A1 and a second amplifier transistor A2 is different from that of the other, and the first amplifier transistor A1 and the second amplifier transistor A2 have different amplification factors. A first amplifier selection transistor AS1 activates the first amplifier transistor A1, and a second amplifier selection transistor AS2 activates the second amplifier transistor A2. The first amplifier transistor A1 and the second amplifier transistor A2 are connected to a first constant current source CCS1 via the first amplifier selection transistor AS1 and the second amplifier selection transistor AS2, respectively, and form a source follower circuit. A first additional capacitor C1 and a second additional capacitor C2 have different capacitances. A first capacitor selection transistor CS1 activates the first additional capacitor C1, and a second capacitor selection transistor CS2 activates the second additional capacitor C2. The output of the first amplifier transistor A1 or the second amplifier transistor A2 is input to the clamp circuit in the following stage. In the illustrated example, five outputs in which the sensitivity and the dynamic range are set for the same amount of signal charge are possible by a combination of turning on and off the first amplifier selection transistor AS1, the second amplifier selection transistor AS2, the first capacitor selection transistor CS1, and the second capacitor selection transistor CS2. In the illustrated example, therefore, the amplifier circuit 500 has a plurality of selectable amplifier transistors (A1, A2). The amplifier circuit 500 further has a plurality of selectable additional capacitors (C1, C2).

A description will be given of the clamp circuit. The clamp circuit includes a clamp capacitor CL, a clamp selection transistor CLS, and a third amplifier transistor A3. The third amplifier transistor A3 is connected to a second constant current source CCS2, and forms a source follower circuit. The output from the third amplifier transistor A3 is output to the S/H circuit in the following stage. The clamp selection transistor CLS is turned on after the reset transistor RS is turned on, thereby allowing the output of the third amplifier transistor A3 when the reset transistor RS is turned off to become equal to a value (signal component) obtained by subtracting from the output of the amplifier circuit 500 (signal component+noise component) the noise component obtained when the reset transistor RS is turned on.

A description will be given of the S/H circuit. The S/H circuit includes a first sampling transistor SH1, a second sampling transistor SH2, a first holding capacitor CH1, and a second holding capacitor CH2. The first sampling transistor SH1 is turned on, thereby allowing the signal component to be held as charge in the first holding capacitor CH1, and the second sampling transistor SH2 is turned on, thereby allowing the noise component to be held as charge in the second holding capacitor CH2.

A description will be given of the buffer circuit. The buffer circuit includes a first buffer transistor B1 and a second buffer transistor B2. The first buffer transistor B1 is connected to a third constant current source CCS3, and forms a source follower circuit. The second buffer transistor B2 is connected to a fourth constant current source CCS4, and forms a source follower circuit. The output of the first buffer transistor B1 is output to a signal line S by turning on a first switch S1, and the output of the second buffer transistor B2 is output to a noise line N by turning on a second switch S2. In the above manner, an intensity signal indicating the intensity of energy rays may be obtained from each pixel via either line. A configuration similar to that of the above pixel circuit is disclosed in Japanese Patent Laid-Open No. 2002-344809, and may be employed in this embodiment.

A method for manufacturing the detection device according to the fifth embodiment will be described. The radiation ray detection device according to this embodiment may be manufactured by the operations a to k and m described in the first embodiment, and descriptions of the operations a to k and m are thus omitted. It is to be understood that the present embodiment may also be applied to the second to fourth embodiments.

Figure 13B:
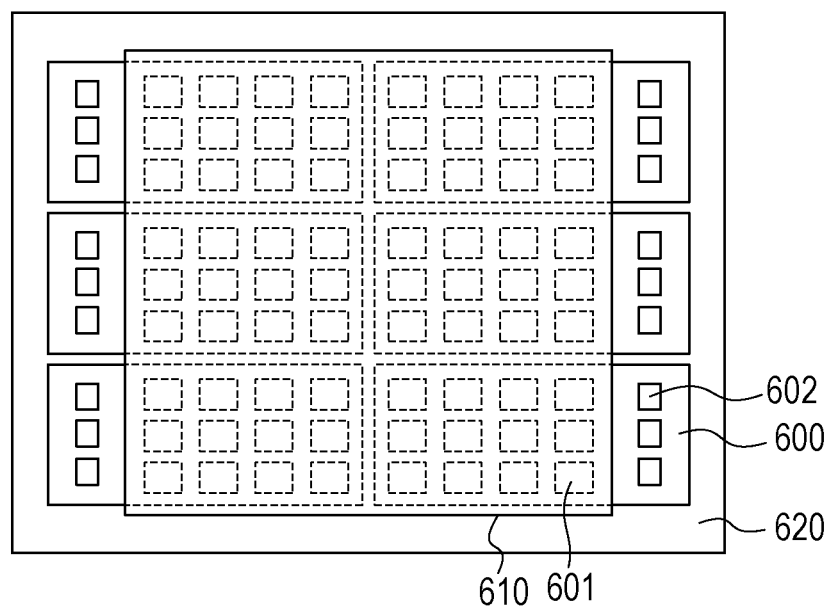
FIG. 13B is a schematic plan view of the energy ray detection device according to the fifth embodiment.
Figure 13C:
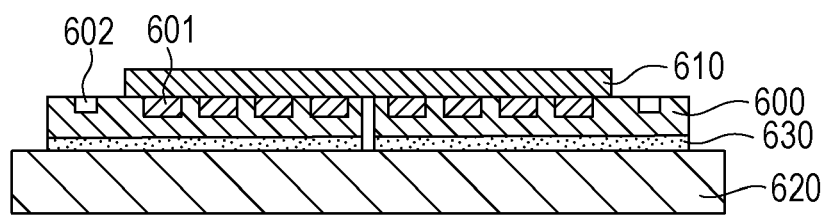
FIG. 13C is a schematic cross-sectional view of the energy ray detection device according to the fifth embodiment.

(Operation x): This operation will be described with reference to FIGS. 13B and 13C. FIG. 13B is a schematic plan view of the detection device, and FIG. 13C is a schematic cross-sectional view of the detection device. After the operation k, an interlayer insulating film is formed on the insulating film, if necessary, and connection wiring 330 is further formed on the interlayer insulating film 320. A plurality of chips 600, each including the semiconductor substrate 100 described above and obtained in the above way, are prepared. Here, six chips 600, each having 12 pixels 601 formed thereon, are prepared by way of example. In actuality, however, each chip has a larger number of pixels, for example, 10,000 pixels or more, formed thereon. For example, 14 (vertical) by 2 (horizontal) chips 600, i.e., a total of 28 chips 600, each having 200 (vertical) by 1,000 (horizontal) pixels, i.e., a total of 200,000 pixels, arranged thereon, may be arranged. Therefore, an imaging device including 2,800 (vertical) by 2,000 (horizontal) pixels, i.e., a total of 5,600,000 pixels, may be obtained.

The plurality of chips 600 are two-dimensionally bonded to a plate-shaped holding member 620 using an adhesive 630.

Further, a wavelength conversion member 610 that converts the wavelength of energy rays is fixed onto the chips 600 using an adhesive or the like (not illustrated). If the energy rays to be detected are X-rays, a fluorescent member (scintillator) that emits visible light rays in accordance with the irradiation of X-rays may be used as the wavelength conversion member 610. In addition, a wavelength selection member may also be arranged between the wavelength conversion member 610 and the chips 600, if necessary. If the wavelength conversion member 610 serves to convert radiation rays into visible light rays, a monochromatic color filter whose transmission region extends to the emission wavelength of the fluorescent member may be used as the wavelength selection member. A wiring member such as a flexible printed circuit (FPC) is connected to electrode pads 602 provided on the chips 600, and power supply or drive signals are input to the electrode pads 602. Further, obtained image signals are output from the electrode pads 602.

As described above, an energy ray detection device according to an embodiment discussed herein includes an active part 120 having a first-conductivity-type semiconductor region where signal charge generated in accordance with energy rays resides as majority carriers, and a contact portion 300 connected to the active part 120. The first-conductivity-type semiconductor region includes a first semiconductor region 131 disposed below a first area 1001 on a surface 1000 of a semiconductor substrate, a second semiconductor region 132 disposed below a second area 1002 on the surface 1000 and connected to the contact portion 300, and a third semiconductor region 133 disposed below a third area 1003 on the surface 1000 between the first area 1001 and the second area 1002. A method for manufacturing the energy ray detection device may include an operation of forming on a semiconductor substrate 100 a buffer film 200 that covers the first area 1001 and the third area 1003, a portion of the buffer film 200 which covers the third area 1003 having a thickness smaller than a portion of the buffer film 200 which covers the first area 1001. The method may further include an operation of forming the first semiconductor region 131 and the second semiconductor region 132 by implanting ions of first-conductivity-type impurities into the semiconductor substrate 100 through the buffer film 200.

In the first embodiment, the first semiconductor region 131, the second semiconductor region 132, and the third semiconductor region 133 are included in a first charge generation region 130 where signal charge is generated in accordance with the irradiation of energy rays. That is, the energy ray detection device includes a semiconductor substrate having a first charge generation region 130 where signal charge is generated in accordance with the irradiation of energy rays and where the signal charge resides as majority carriers, and a contact portion 300 connected to a portion of the first charge generation region 130. The first charge generation region 130 has a first semiconductor region 131 disposed below the first area 1001 on the surface 1000 of the semiconductor substrate 100, a second semiconductor region 132 disposed below the second area 1002 on the surface 1000 and connected to the contact portion 300, and a third semiconductor region 133 disposed below the third area 1003 on the surface 1000 between the first area 1001 and the second area 1002. The first semiconductor region 131 and the third semiconductor region 133 may be formed by performing ion implantation through the buffer film 200.

In the second embodiment, the first semiconductor region 131 and the third semiconductor region 133 are included in a first charge generation region 130 where signal charge is generated in accordance with the irradiation of energy rays, and the second semiconductor region 132 is included in a floating diffusion region 170. The active part 120 includes a channel region 144 disposed between the charge generation region 130 and the floating diffusion region 170, and the channel region 144 has a channel through which signal charge is transferred from the charge generation region 130 to the floating diffusion region 170. That is, the energy ray detection device includes a semiconductor substrate 100 having a charge generation region 130 where signal charge is generated in accordance with the irradiation of energy rays and where signal charge resides as majority carriers, a floating diffusion region 170 where signal charge resides as majority carriers, and a channel region 144 disposed between the charge generation region 130 and the floating diffusion region 170 and having a channel through which signal charge is transferred from the charge generation region 130 to the floating diffusion region 170; and a contact portion 300 connected to a portion of the floating diffusion region 170. The charge generation region 130 has a first semiconductor region 131 disposed below the first area 1001 on the surface 1000 of the semiconductor substrate 100. The floating diffusion region 170 has a second semiconductor region 132 disposed below the second area 1002 on the surface 1000 and connected to the contact portion 300. Further, the charge generation region 130 has a third semiconductor region 133 disposed below the third area 1003 on the surface 1000 between the first area 1001 and the second area 1002. The first semiconductor region 131 and the third semiconductor region 133 may be formed by performing ion implantation through the buffer film 200.

In the third embodiment, the first semiconductor region 131, the second semiconductor region 132, and the third semiconductor region 133 are included in a floating diffusion region 170. The active part 120 includes a charge generation region 130 and the floating diffusion region 170. The active part 120 further includes a channel region 144 disposed between the charge generation region 130 and the floating diffusion region 170. In the channel region 144, a channel through which signal charge is transferred from the charge generation region 130 to the floating diffusion region 170 is formed. That is, the energy ray detection device includes a semiconductor substrate having a charge generation region 130 where signal charge is generated in accordance with the irradiation of energy rays and where signal charge resides as majority carriers, a floating diffusion region 170 where the signal charge resides as majority carriers, and a channel region 144 disposed between the charge generation region 130 and the floating diffusion region 170 and having a channel through which signal charge is transferred from the charge generation region 130 to the floating diffusion region 170; and a contact portion 300 connected to a portion of the floating diffusion region 170. The floating diffusion region 170 has a first semiconductor region 131 disposed below the first area 1001 on the surface 1000 of the semiconductor substrate 100, a second semiconductor region 132 disposed below the second area 1002 on the surface 1000 and connected to the contact portion 300, and a third semiconductor region 133 disposed below the third area 1003 on the surface 1000 between the first area 1001 and the second area 1002. The first semiconductor region 131 and the third semiconductor region 133 may be formed by performing ion implantation through the buffer film 200.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2011-150894, filed Jul. 7, 2011, which is hereby incorporated by reference herein in its entirety.

What is claimed is:

1. A method for manufacturing an energy ray detection device including an active part and a contact portion connected to the active part, the active part including a semiconductor region having a first conductivity type where signal charge generated in accordance with energy rays resides as majority carriers, the semiconductor region including
a first region disposed below a first area on a surface of a semiconductor substrate,
a second region disposed below a second area on the surface and connected to the contact portion, and
a third region disposed below a third area on the surface between the first area and the second area, the method comprising:

forming a buffer film on the semiconductor substrate, the buffer film covering the first area and the third area, a portion of the buffer film that covers the third area having a thickness smaller than a portion of the buffer film that covers the first area; and forming the first region and the third region, comprising performing ion implantation of impurities having the first conductivity type into the semiconductor substrate through the buffer film.

2. The method according to claim 1, wherein the first region, the second region, and the third region are included in a charge generation region where signal charge is generated in accordance with irradiation of energy rays.

3. The method according to claim 2, wherein performing ion implantation through the buffer film comprises performing ion implantation a plurality of times; performing ion implantation with first implantation energy; and performing ion implantation with a second implantation energy lower than the first implantation energy.

4. The method according to claim 2, wherein a semiconductor region having a second conductivity type is formed between the charge generation region and the surface.

5. The method according to claim 1, wherein
the first region and the third region are included in a charge generation region where signal charge is generated in accordance with irradiation of energy rays, and the second region is included in a floating diffusion region, and
the active part includes a channel region disposed between the charge generation region and the floating diffusion region, the channel region having a channel through which the signal charge is transferred from the charge generation region to the floating diffusion region.

6. The method according to claim 5, wherein performing ion implantation through the buffer film comprises performing ion implantation a plurality of times; performing ion implantation with first implantation energy; and performing ion implantation performed with a second implantation energy lower than the first implantation energy.

7. The method according to claim 1, wherein
the first region, the second region, and the third region are included in a floating diffusion region, and
the active part includes a charge generation region, and a channel region disposed between the charge generation region and the floating diffusion region, the channel region having a channel through which the signal charge is transferred from the charge generation region to the floating diffusion region.

8. The method according to claim 1, wherein performing the ion implantation through the buffer film comprises performing ion implantation a plurality of times; performing ion implantation with first implantation energy; and performing ion implantation with a second implantation energy lower than the first implantation energy.

9. The method according to claim 8, wherein performing the ion implantation with the first implantation energy comprises performing the ion implantation with the first implantation energy at a dose higher than a dose at which the ion implantation with the second implantation energy is performed.

10. The method according to claim 8, wherein performing the ion implantation with the second implantation energy comprises performing the ion implantation with the second implantation energy after the ion implantation with the first implantation energy is performed.

11. The method according to claim 1, wherein the first area surrounds the third area, and the second area is surrounded by the third area.

12. The method according to claim 1, wherein the first area is continuous with the third area.

13. The method according to claim 1, wherein
the buffer film covers the second area, and a portion of the buffer film that covers the second area has a thickness smaller than a portion of the buffer film that covers the third area, and
the second region is formed on the semiconductor substrate by performing ion implantation of impurities having the first conductivity type through the buffer film.

14. The method according to claim 13, wherein the second region is formed by performing the ion implantation through the buffer film and by performing ion implantation without using the buffer film.

15. The method according to claim 1, wherein
the first region, the second region, and the third region are formed in the active part, the active part being surrounded by an isolation part,
an amplifier circuit that generates an amplified signal based on signal charge is formed in another active part that is separated from the active part by the isolation part, and
the contact portion is formed so as to be connected to the first region and the amplifier circuit across the isolation part.

16. The method according to claim 1, wherein the buffer film is a photosensitive resin film processed so as to have a thickness distribution using a gradation exposure method.

17. The method according to claim 1, wherein the buffer film is an inorganic insulating film processed so as to have a thickness distribution using an isotropic etching method or an anisotropic etching method.

18. The method according to claim 1, wherein at least one of a wavelength conversion member that converts a wavelength of energy rays and a wavelength selection member that selects a wavelength of energy rays is arranged on the semiconductor substrate.

19. The method according to claim 1, wherein a fluorescent member that emits visible light rays in accordance with irradiation of X-rays is arranged on the semiconductor substrate.

* * * * *